(12) United States Patent
Lin et al.

(10) Patent No.: US 11,217,629 B2
(45) Date of Patent: Jan. 4, 2022

(54) SEMICONDUCTOR DEVICE AND MANUFACTURING METHOD THEREOF

(71) Applicant: Taiwan Semiconductor Manufacturing Co., Ltd., Hsinchu (TW)

(72) Inventors: Meng-Han Lin, Hsinchu (TW); Sai-Hooi Yeong, Hsinchu County (TW); Yu-Ming Lin, Hsinchu (TW); Han-Jong Chia, Hsinchu (TW); Chenchen Jacob Wang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 0 days.

(21) Appl. No.: 16/877,497

(22) Filed: May 19, 2020

(65) Prior Publication Data

US 2021/0366985 A1   Nov. 25, 2021

(51) Int. Cl.
| *H01L 27/24* | (2006.01) |
| *H01L 29/423* | (2006.01) |
| *H01L 29/66* | (2006.01) |
| *H01L 29/786* | (2006.01) |
| *H01L 45/00* | (2006.01) |

(52) U.S. Cl.
CPC .... *H01L 27/2436* (2013.01); *H01L 29/42392* (2013.01); *H01L 29/66742* (2013.01); *H01L 29/78696* (2013.01); *H01L 45/1608* (2013.01)

(58) Field of Classification Search
CPC .......... H01L 27/2436; H01L 29/42392; H01L 27/66742; H01L 29/78696; H01L 45/1608
USPC ......................................................... 257/379
See application file for complete search history.

(56) References Cited

U.S. PATENT DOCUMENTS

| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,879,308 B1 * | 12/2020 | Ando ................ H01L 45/146 |
| 2019/0013414 A1 * | 1/2019 | Shu ................ H01L 29/66742 |

* cited by examiner

*Primary Examiner* — Tong-Ho Kim
(74) *Attorney, Agent, or Firm* — JCIPRNET

(57) ABSTRACT

A semiconductor device includes a transistor and a memory device. The transistor includes a gate stack and a nanosheet penetrating through the gate stack. The memory device has a first portion and a second portion. A first portion of the gate stack is sandwiched between the first portion and the second portion of the memory device.

20 Claims, 36 Drawing Sheets

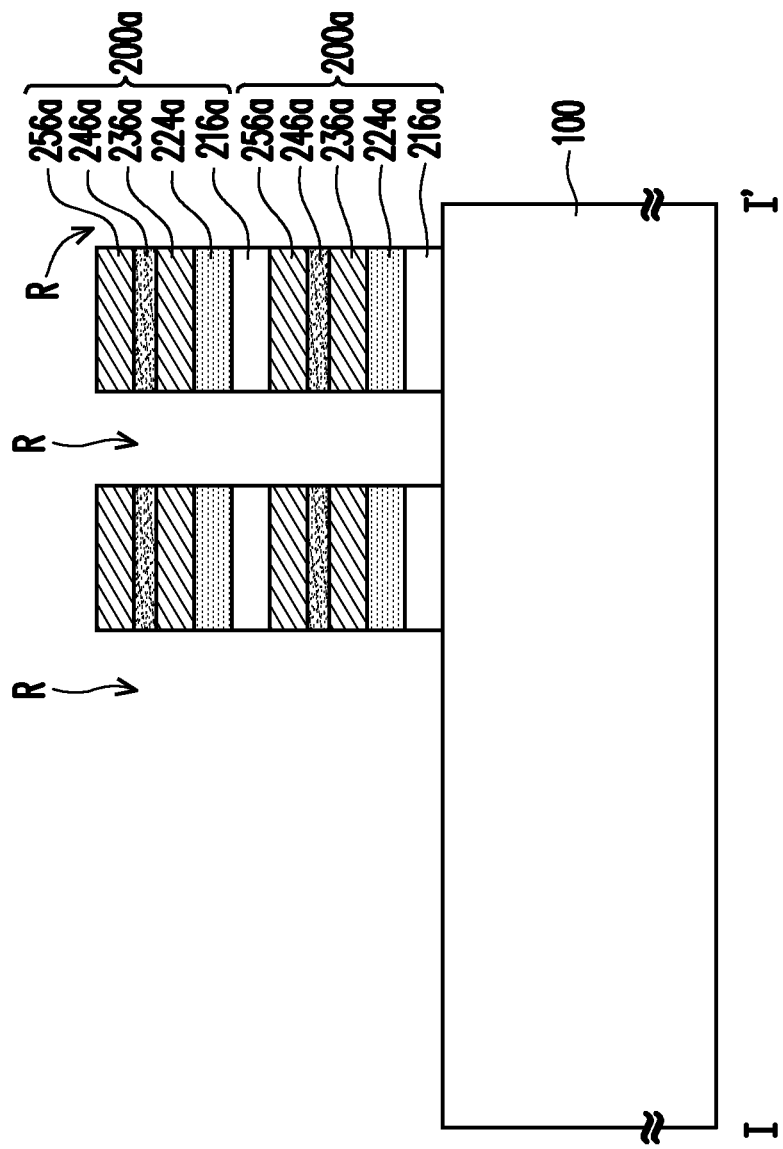

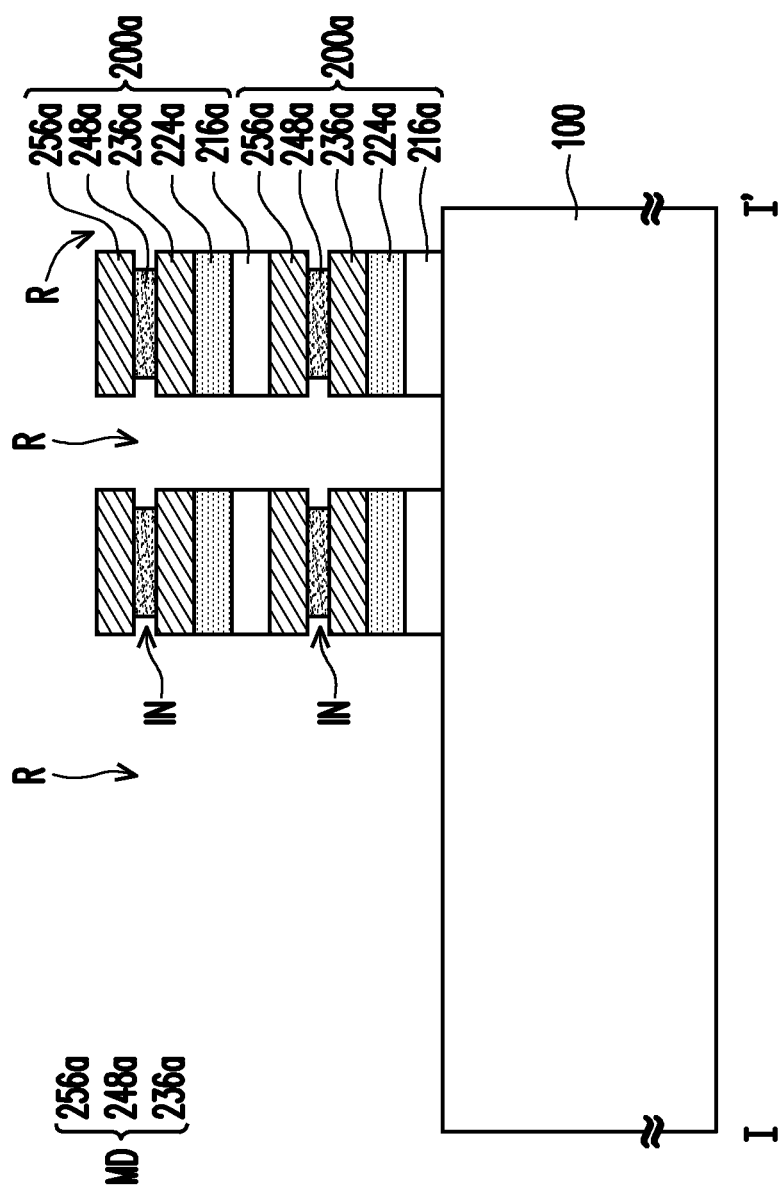

SEMICONDUCTOR DEVICE AND MANUFACTURING METHOD THEREOF

BACKGROUND

Many modern day electronic devices contain electronic memory configured to store data. Electronic memory may be volatile memory or non-volatile memory. Volatile memory stores data while it is powered, while non-volatile memory is able to store data when power is removed. Resistive random access memory (RRAM) is one promising candidate for next generation non-volatile memory technology due to its simple structure and its compatibility with CMOS logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A to FIG. 2K and FIG. 3A to FIG. 3K are cross-sectional views illustrating various stages of the method of manufacturing the semiconductor device in FIG. 1A to FIG. 1K.

DETAILED DESCRIPTION

Figure 1A:
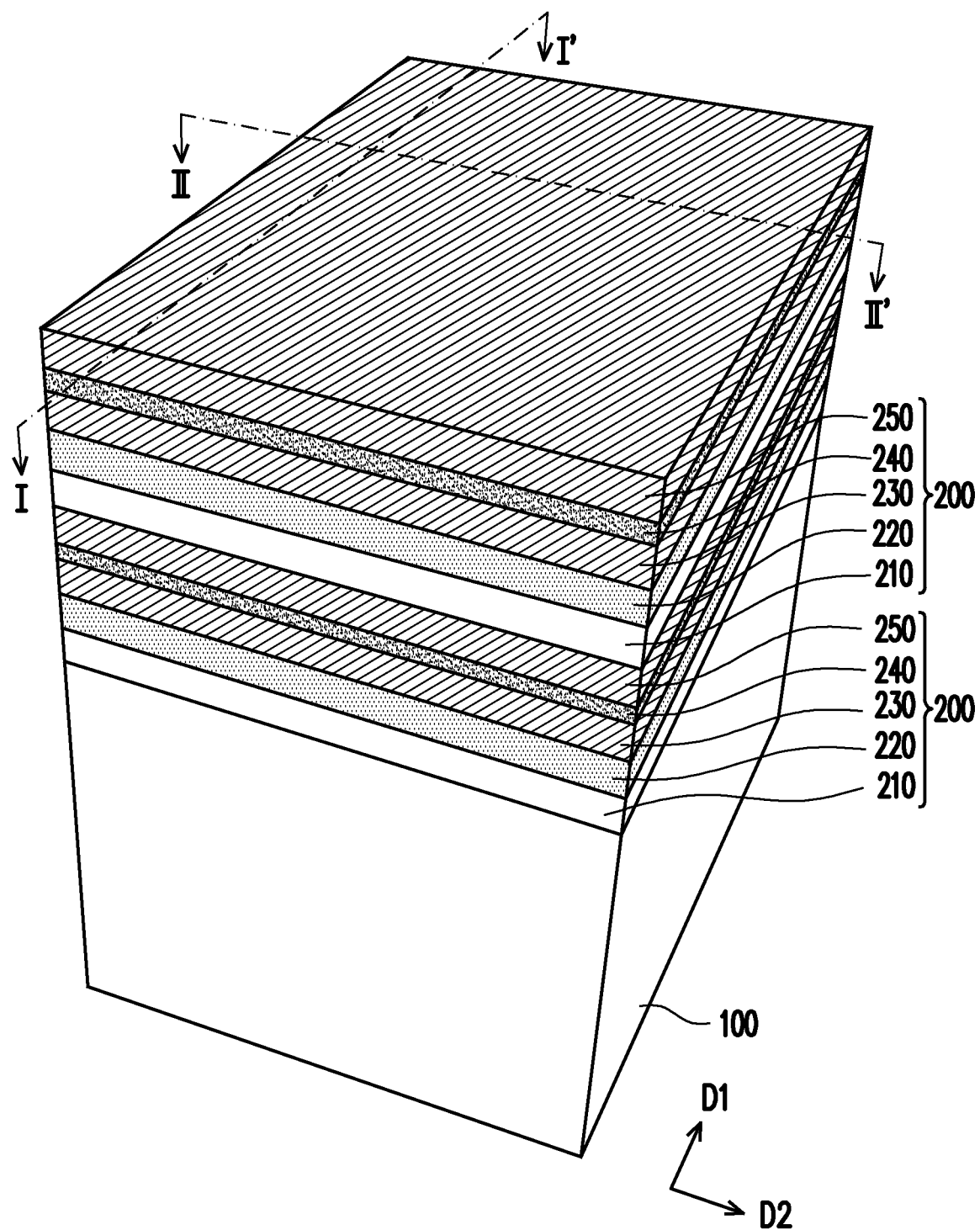
FIG. 1A to FIG. 1K are perspective views illustrating various stages of a method of manufacturing a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 2A:
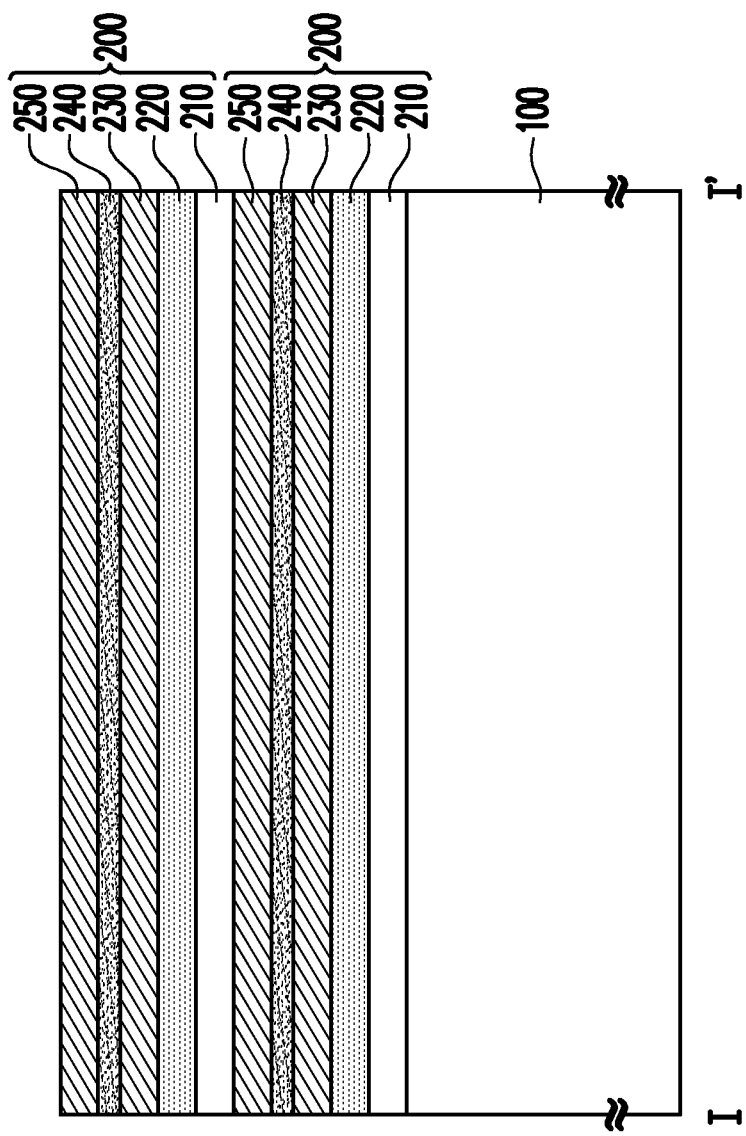
Figure 3A:
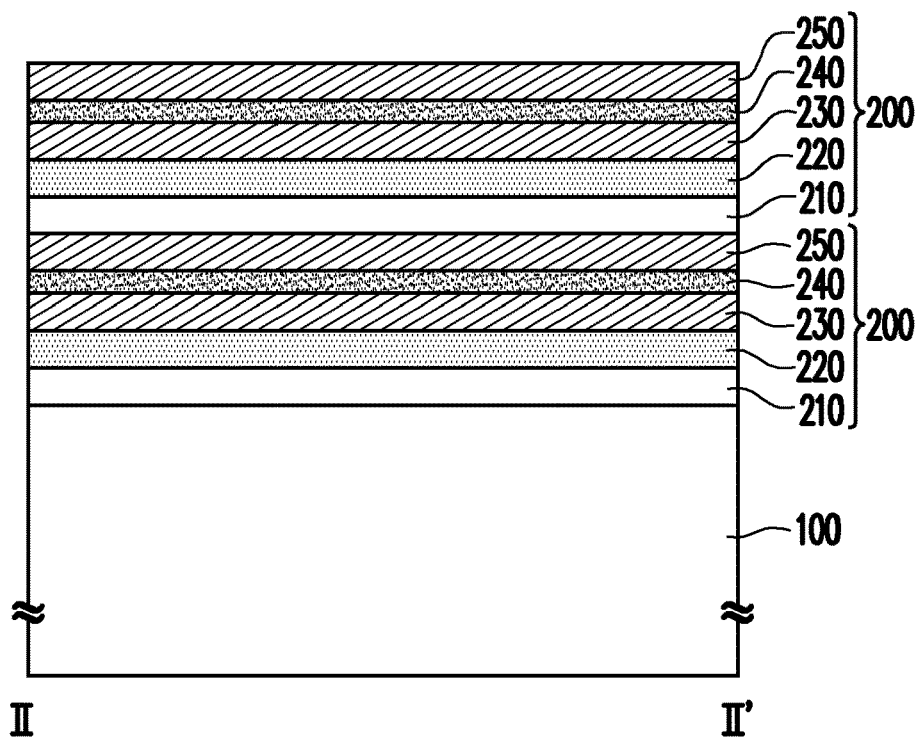

FIG. 1A is a perspective view illustrating one of various stages of a method of manufacturing a semiconductor device 10 in accordance with some embodiments of the disclosure. FIG. 2A is a cross-sectional view taken along line I-I' of FIG. 1A and FIG. 3A is a cross-sectional view taken along line II-II' of FIG. 1A. In some embodiments, line I-I' extends along a first direction D1 and line II-II' extends along a second direction D2 perpendicular to the first direction D1. Referring to FIGS. 1A, 2A, and 3A, a substrate 100 is provided. The substrate 100 may include a semiconductor wafer, a semiconductor-on-insulator (SOI) wafer, or an epitaxial wafer. The substrate 100 may be doped (e.g., with a p-type or an n-type dopant) or undoped. In some embodiments, the semiconductor wafer, the SOI wafer, or the epitaxial wafer include an elemental semiconductor material or a compound semiconductor material. For example, the elemental semiconductor may include Si or Ge. The compound semiconductor may include SiGe, SiC, SiGeC, a III-V semiconductor or a II-VI semiconductor. For example, the III-V semiconductor includes GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs or InAlPAs. The II-VI semiconductor may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe or HgZnSTe.

As illustrated in FIGS. 1A, 2A, and 3A, a plurality of film stack structures 200 is formed over the substrate 100. The film stack structures 200 are stacked on one another. In some embodiments, each film stack structure 200 includes a first isolation material layer 210, a semiconductor material layer 220, a first metal layer 230, a storage material layer 240, and a second metal layer 250 stacked in sequential order.

In some embodiments, the first isolation material layer 210 includes silicon oxide, silicon nitride, silicon oxynitride, a spin-on dielectric material, or a low-k dielectric material. Herein, the low-k dielectric materials are generally dielectric materials having a dielectric constant lower than 3.9. The first isolation material layer 210 may be formed by spin-on coating, chemical vapor deposition (CVD), plasma-enhanced chemical vapor deposition (PECVD), flowable chemical vapor deposition (FCVD), high-density-plasma chemical vapor deposition (HDP-CVD), sub-atmospheric CVD (SACVD), physical vapor deposition (PVD), or atomic layer deposition (ALD).

In some embodiments, the semiconductor material layer 220 is formed on the first isolation material layer 210. In some embodiments, the semiconductor material layer 220 includes polysilicon or amorphous silicon. In some alternative embodiments, the semiconductor material layer 220 may be made of some other suitable elemental semiconductor, such as diamond or germanium; a suitable compound semiconductor, such as gallium arsenide, silicon carbide, gallium phosphide, indium phosphide, indium arsenide, and/or indium antimonide; or a suitable alloy semiconductor, such as SiGe, GaAsP, AlInAs, AlGaAs, GaInAs, GaInP, and/or GaInAsP. However, the disclosure is not limited thereto. In some embodiments, the semiconductor material layer 220 may be made of oxide semiconductors, such as ZnO, IGZO, ITO, IWO, or the like. In some embodiments, the semiconductor material layer 220 and the substrate 100 may be made of the same material. However, the disclosure is not limited thereto. In some alternative embodiments, the semiconductor material layer 220 and the substrate 100 may be made of different materials. In some embodiments, the semiconductor material layer 220 may be doped or undoped. When the semiconductor material layer 220 is doped, the dopant may include p-type or n-type dopants. The p-type dopants are, for example, boron, $BF_2$, or a combination thereof. On the other hand, the n-type dopants are, for example, phosphorus, arsenic, or a combination thereof. The semiconductor material layer 220 may be formed by CVD, PECVD, FCVD, HDP-CVD, SACVD, PVD, or ALD.

In some embodiments, the first metal layer 230 is formed on the semiconductor material layer 220. In some embodiments, the first metal layer 230 includes Al, Ti, TiN, TaN, Co, Ag, Au, Cu, Ni, Cr, Hf, Ru, W, Pt, or the like. In some embodiments, the first metal layer 230 may be formed by CVD, PECVD, FCVD, HDP-CVD, SACVD, PVD, or ALD. However, the disclosure is not limited thereto. In some alternative embodiments, the first metal layer 230 may be formed by a plating process.

In some embodiments, the storage material layer 240 is formed on the first metal layer 230. In some embodiments, the storage material layer 240 includes a high-k dielectric material having a variable resistance. For example, the storage material layer 240 includes a single or composite film of $HfO_2$, $Hr_{1-x}Zr_xO_2$, $ZrO_2$, $TiO_2$, $NiO$, $TaO_x$, $Cu_2O$, $Nb_2O_5$, $Al_2O_3$, $MoO_x$, $CoO$, $ZnO$, $WO_3$, $V_2O_5$, $Fe_3O_4$, $SrZrO_3$, $SrTiO_3$, $Pr_{1-x}Ca_xMnO_3$, $La_{1-x}Ca_xMnO$, or the like. The storage material layer 240 may be formed by CVD, PECVD, FCVD, HDP-CVD, SACVD, PVD, or ALD. Since the storage material layer 240 has a variable resistance, the storage material layer 240 may be utilized to store data.

In some embodiments, the second metal layer 250 is formed on the storage material layer 240. For example, the storage material layer 240 is sandwiched between the first metal layer 230 and the second metal layer 250. In some embodiments, a material of the second metal layer 250 may be the same as the material of the first metal layer 230. However, the disclosure is not limited thereto. In some alternative embodiments, the material of the second metal layer 250 may be different from the material of the first metal layer 230. Examples of the material of the second metal layer 250 include Al, Ti, TiN, TaN, Co, Ag, Au, Cu, Ni, Cr, Hf, Ru, W, Pt, or the like. In some embodiments, the second metal layer 250 may be formed by CVD, PECVD, FCVD, HDP-CVD, SACVD, PVD, or ALD. However, the disclosure is not limited thereto. In some alternative embodiments, the second metal layer 250 may be formed by a plating process.

It should be noted that although two film stack structures 200 are illustrated in FIGS. 1A, 2A, and 3A, the disclosure is not limited thereto. In some alternative embodiments, the number of the film stack structures 200 may be adjusted based on demand. For example, the number of the film stack structures 200 may be up to 32.

Figure 1B:
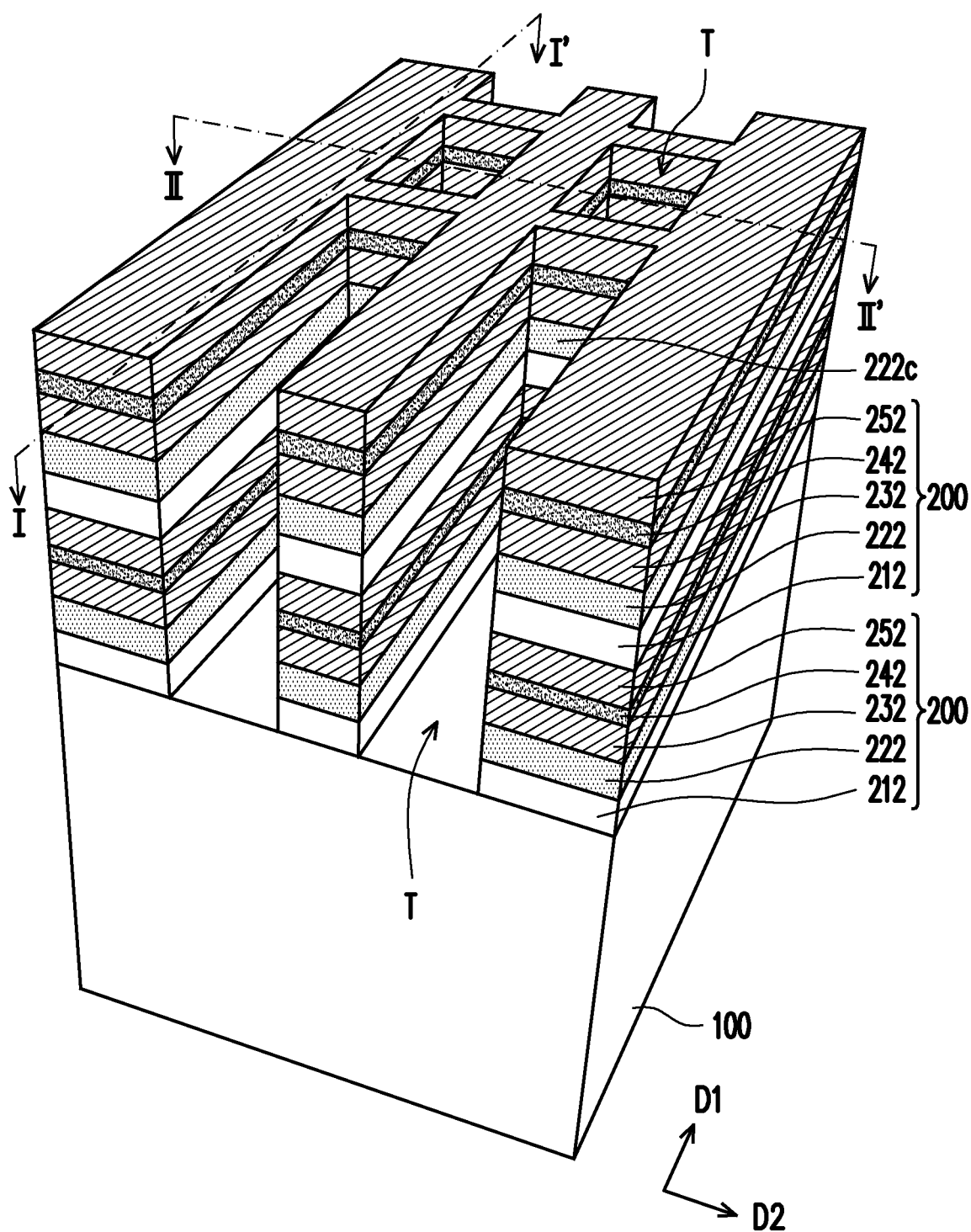
Figure 2B:
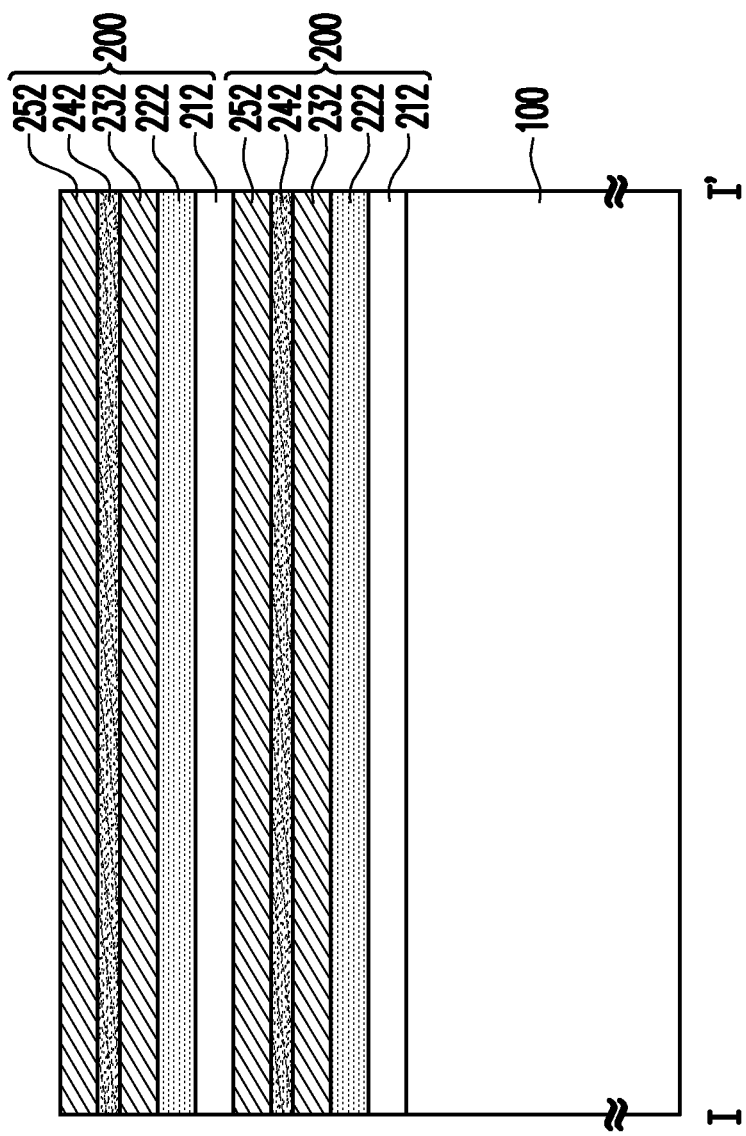
Figure 3B:
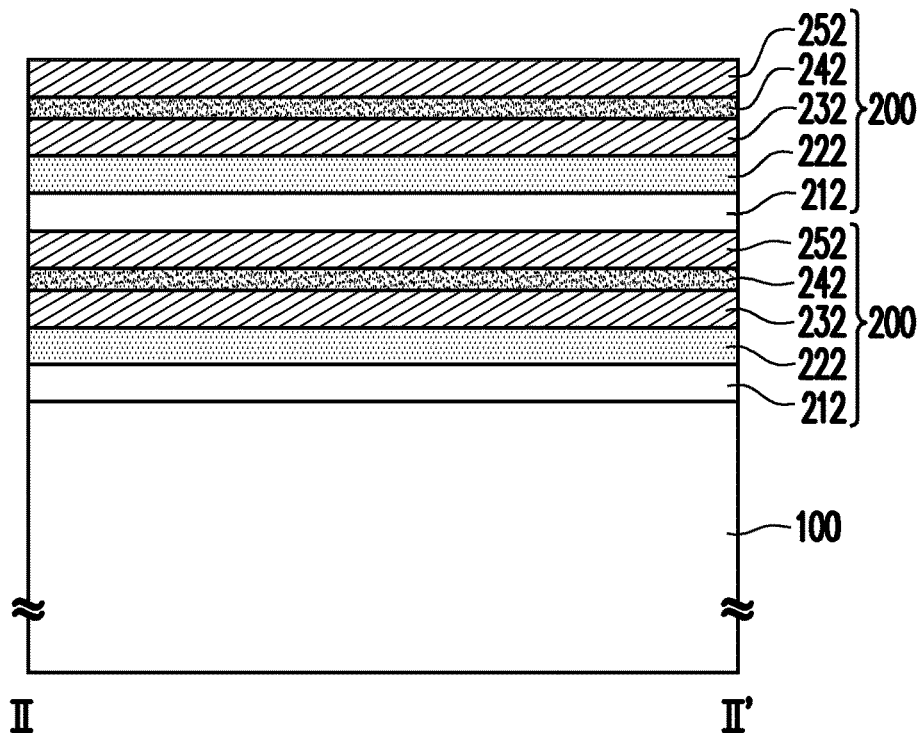

FIG. 1B is a perspective view illustrating one of various stages of a method of manufacturing a semiconductor device 10 in accordance with some embodiments of the disclosure. FIG. 2B is a cross-sectional view taken along line I-I' of FIG. 1B and FIG. 3B is a cross-sectional view taken along line II-II' of FIG. 1B. Referring to FIGS. 1A-1B, 2A-2B, and 3A-3B, a portion of each film stack structure 200 is removed to form a plurality of trenches T in the film stack structures 200. For example, the first isolation material layers 210, the semiconductor material layers 220, the first metal layers 230, the storage material layers 240, and the second metal layers 250 are patterned to respectively form first isolation material layers 212, nanosheets 222, first metal layers 232, storage material layers 242, and second metal layers 252. In some embodiments, the first isolation material layers 210, the semiconductor material layers 220, the first metal layers 230, the storage material layers 240, and the second metal layers 250 may be patterned through a photolithography and/or an etching process. In some embodiments, the etching process includes an isotropic etching process or an anisotropic etching process. For example, the etching process includes a wet etching process, a dry etching process, a combination thereof, or the like.

As illustrated in FIG. 1B, the film stack structures 200 are patterned to form three film stacks extending along the first direction D1 and four film stacks extending along the second direction D2. However, the disclosure is not limited thereto. In some alternative embodiments, the number of the film stacks extending along the first direction D1 and the second direction D2 may be adjusted based on demand. As illustrated in FIG. 1B, the film stacks extending along the second direction D2 connect the film stacks extending along the first direction D1.

In some embodiments, each nanosheet 222 includes a plurality of channels 222c embedded in the film stacks extending along the second direction D2. In some embodiments, the trenches T are formed to penetrate through the film stack structures 200. In some embodiments, shapes of the first isolation material layers 212, the nanosheets 222, the first metal layers 232, the storage material layers 242, and the second metal layers 252 are identical. That is, contours of the first isolation material layers 212, the nanosheets 222, the first metal layers 232, the storage material layers 242, and the second metal layers 252 are aligned, and the trenches T have substantially straight sidewalls.

Figure 1C:
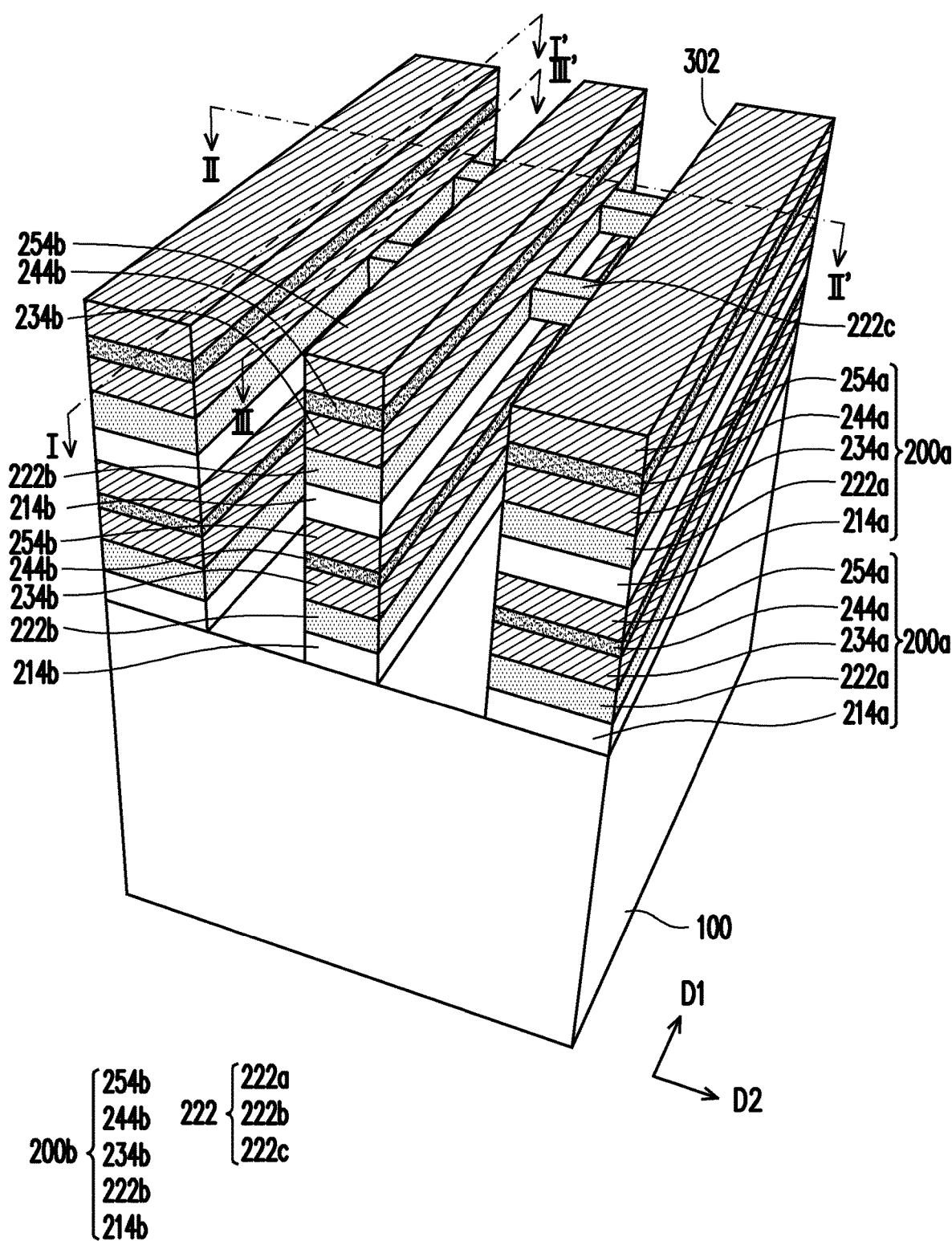
Figure 2C:
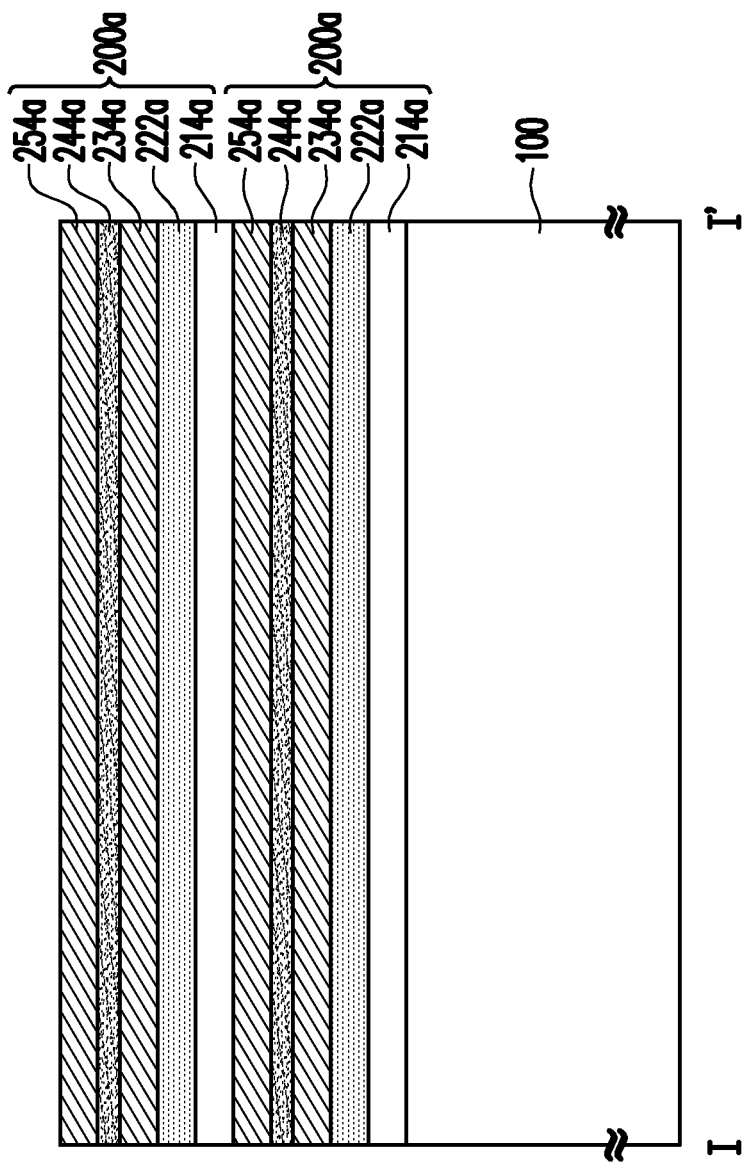
Figure 3C:
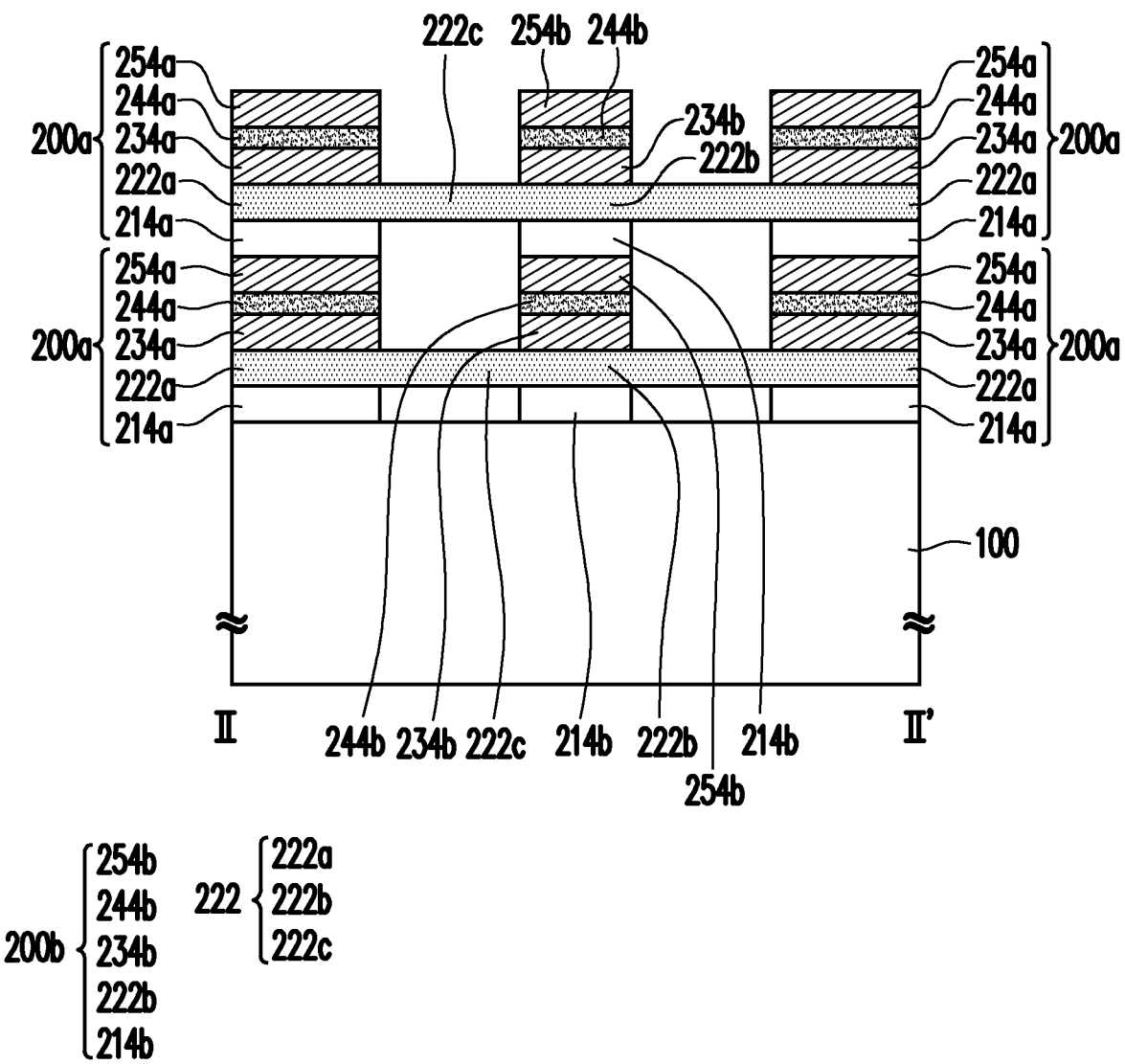

FIG. 1C is a perspective view illustrating one of various stages of a method of manufacturing a semiconductor device 10 in accordance with some embodiments of the disclosure. FIG. 2C is a cross-sectional view taken along line I-I' of FIG. 1C and FIG. 3C is a cross-sectional view taken along line II-II' of FIG. 1C. Referring to FIGS. 1B-1C, 2B-2C, and 3B-3C, the first isolation material layers 212, the first metal layers 232, the storage material layers 242, and the second metal layers 252 above and below the channels 222c of the nanosheets 222 are removed. For example, the first isolation material layers 212, the first metal layers 232, the storage material layers 242, and the second metal layers 252 in the film stacks extending along the second direction D2 are removed. The first isolation material layers 212, the first metal layers 232, the storage material layers 242, and the second metal layers 252 above and below the channels 222c of the nanosheets 222 may be removed through a photolithography and/or an etching process. In some embodiments, the etching process includes an isotropic etching process or an anisotropic etching process. For example, the etching process includes a wet etching process, a dry etching process, a combination thereof, or the like.

In some embodiments, the remaining first isolation material layer 212 becomes a plurality of isolation layers 214a and a plurality of isolation layers 214b, the remaining first metal layer 232 becomes a plurality of first metal layers 234a and a plurality of first metal layers 234b, the remaining storage material layer 242 becomes a plurality of storage layers 244a and a plurality of storage layers 244b, and the remaining second metal layer 252 becomes a plurality of second metal layers 254a and a plurality of second metal layers 254b. Meanwhile, each nanosheet 222 is divided into a plurality of semiconductor layers 222a, the channels 222c, and a plurality of semiconductor layers 222b. In some embodiments, each isolation layer 214a, each semiconductor layer 222a, each first metal layer 234a, each storage layer 244a, and each second metal layer 254a form a first film stack 200a extending along the first direction D1. On the other hand, each isolation layer 214b, each semiconductor layer 222b, each first metal layer 234b, each storage layer 244b, and each second metal layer 254b form a second film stack 200b extending along the first direction D1. As illustrated in FIG. 1C and FIG. 3C, the isolation layers 214a are spatially separated from the isolation layers 214b, the semiconductor layers 222a are spatially separated from the semiconductor layers 222b, the first metal layers 234a are spatially separated from the first metal layers 234b, the storage layers 244a are spatially separated from the storage layer 244b, and the second metal layers 254a are spatially separated from the second metal layer 254b. In other words, the first film stacks 200a are spatially separated from the second film stacks 200b. Meanwhile, the semiconductor layers 222a are connected to the semiconductor layers 222b through the channels 222c. In other words, the channels 222c of the nanosheets 222 connect the first film stacks 200a and the second film stacks 200b. In some embodiments, the semiconductor layer 222a and the semiconductor layer 222b of the nanosheet 222 may be collectively referred to as a first portion of the nanosheet 222, and the channel 222c may be referred to as a second portion of the nanosheet 222. As illustrated in FIG. 1C, the first portion (i.e. the semiconductor layer 222a and the semiconductor layer 222b) of the nanosheet 222 extends along the first direction D1 while the second portion (i.e. the channel 222c) of the nanosheet 222 extends along the second direction D2. Depending on etching selectivity and/or etching recipe, portions of each channel 222c may or may not be removed during removal of the first isolation material layers 212, the first metal layers 232, the storage material layers 242, and the second metal layers 252. In other words, depending on etching selectivity and/or etching recipe, the channels 222c may have various shapes. The shapes of the channels 222c will be discussed below in conjunction with FIG. 4A to FIG. 4C.

Figure 4A:
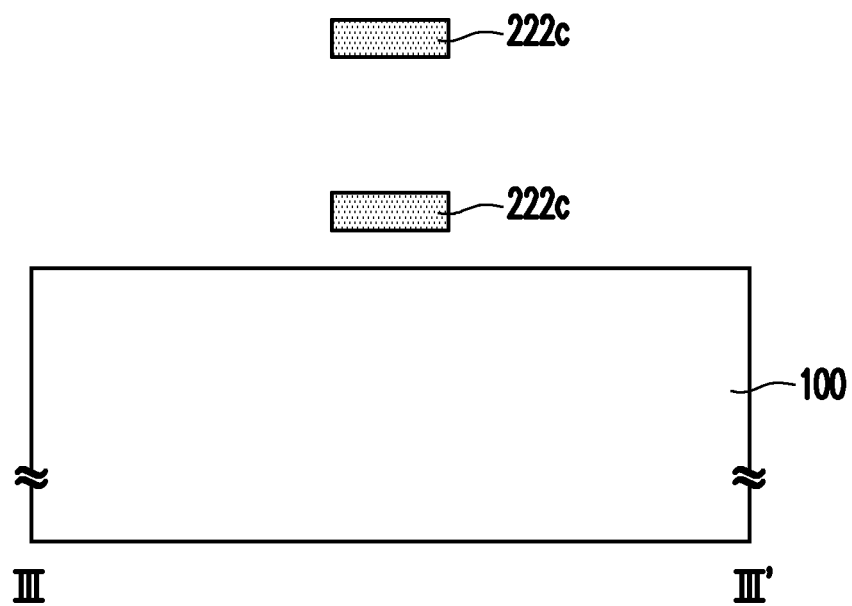
FIG. 4A to FIG. 4C are cross-sectional views illustrating various configurations of the channels in FIG. 1C.
Figure 4B:
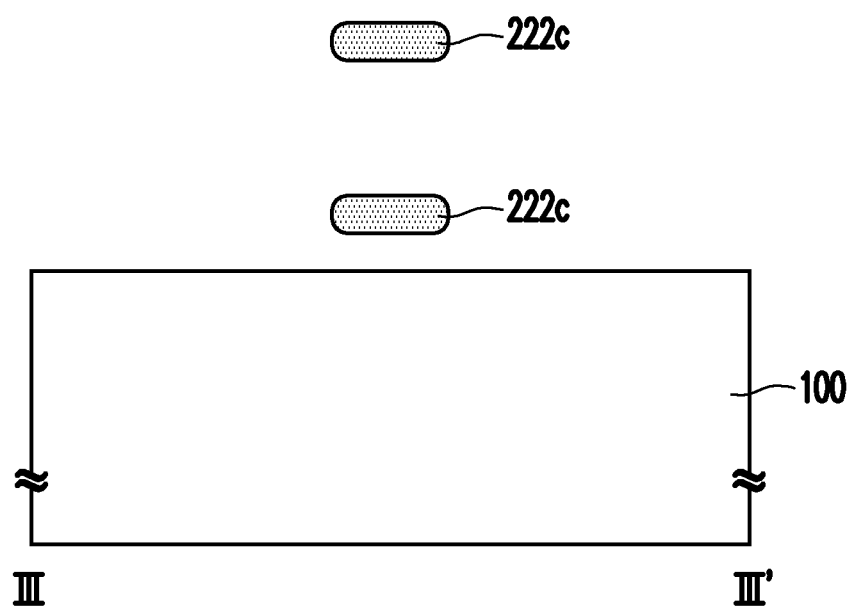
Figure 4C:
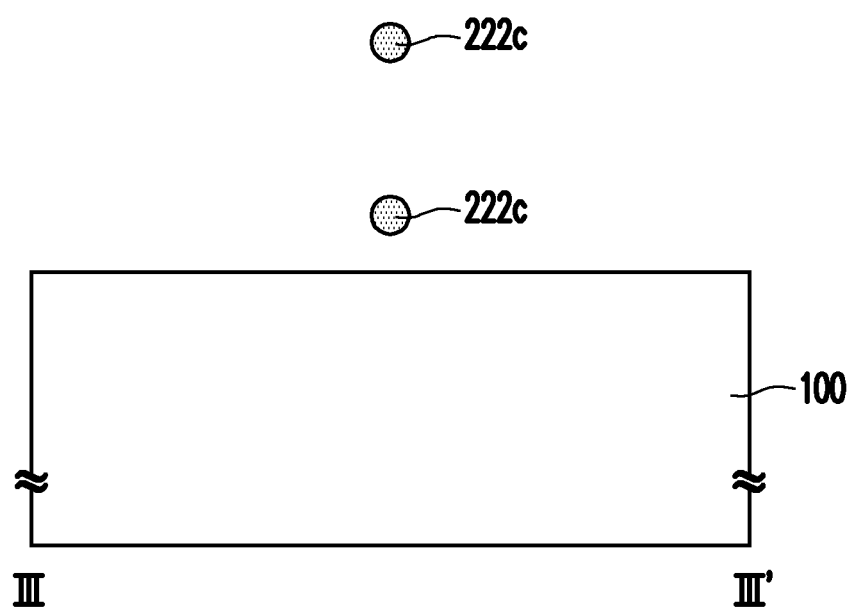

FIG. 4A to FIG. 4C are cross-sectional views illustrating various configurations of the channels 222c taken along line III-III' of FIG. 1C. Referring to FIG. 4A, when the etching selectivity of the channels 222c with respect to other layers is high, the channels 222c are not damaged during removal of other layers, and the cross-sectional view of each channel 222c may be rectangular with straight edges and sharp corners. However, the disclosure is not limited thereto. Referring to FIG. 4B, when the etching selectivity of the channels 222c with respect to other layers is not high enough, the channels 222c may be slightly removed during removal of other layers, thereby rendering rounded corners. For example, as illustrated in FIG. 4B, the cross-sectional view of each channel 222c may be rectangular with rounded corners. In some embodiments, when the etching selectivity of the channels 222c with respect to other layers is low, a significant amount of channel 222c may be removed during removal of other layers. For example, referring to FIG. 4C, the cross-sectional view of each channel 222c may be circular or elliptical.

Figure 1D:
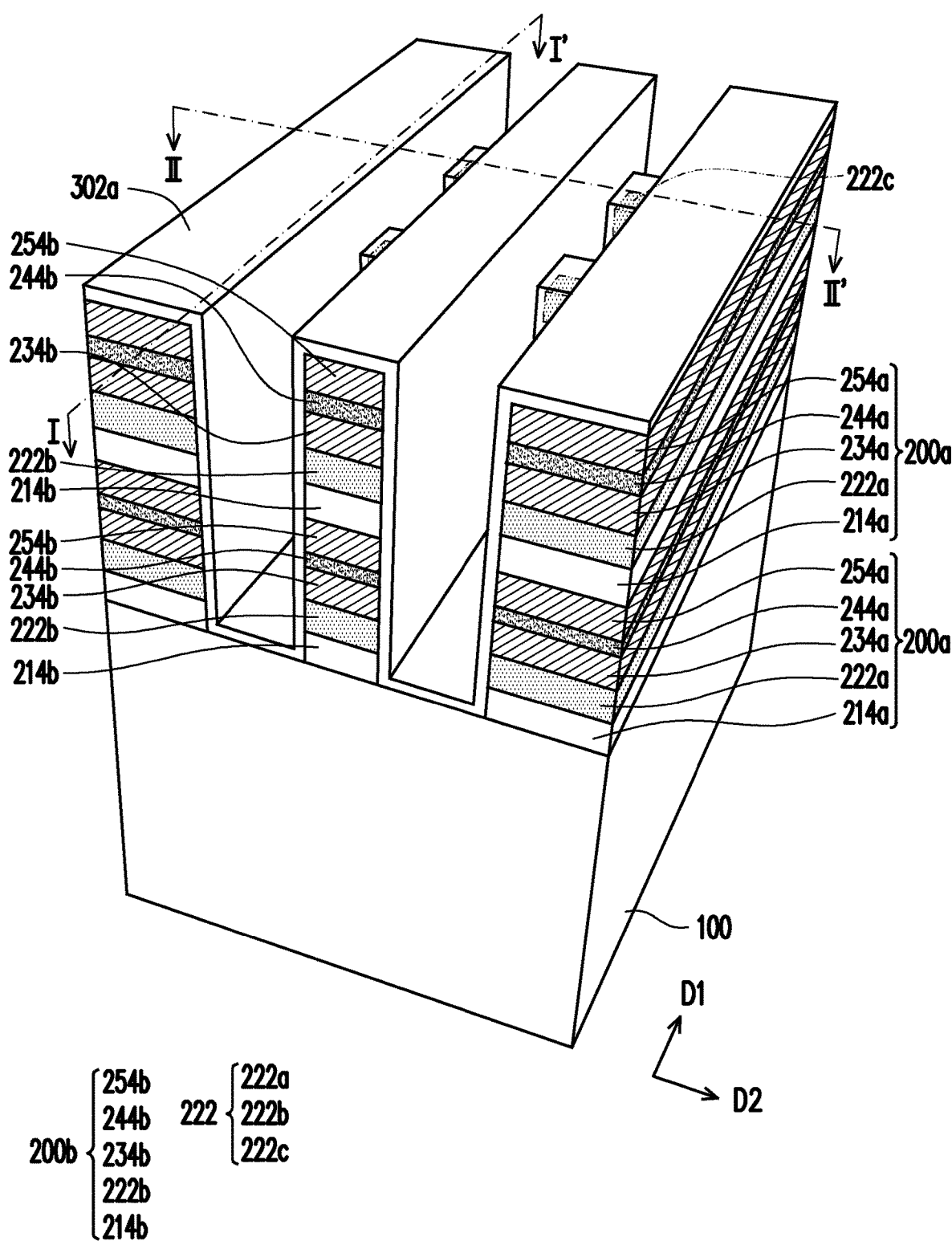
Figure 2D:
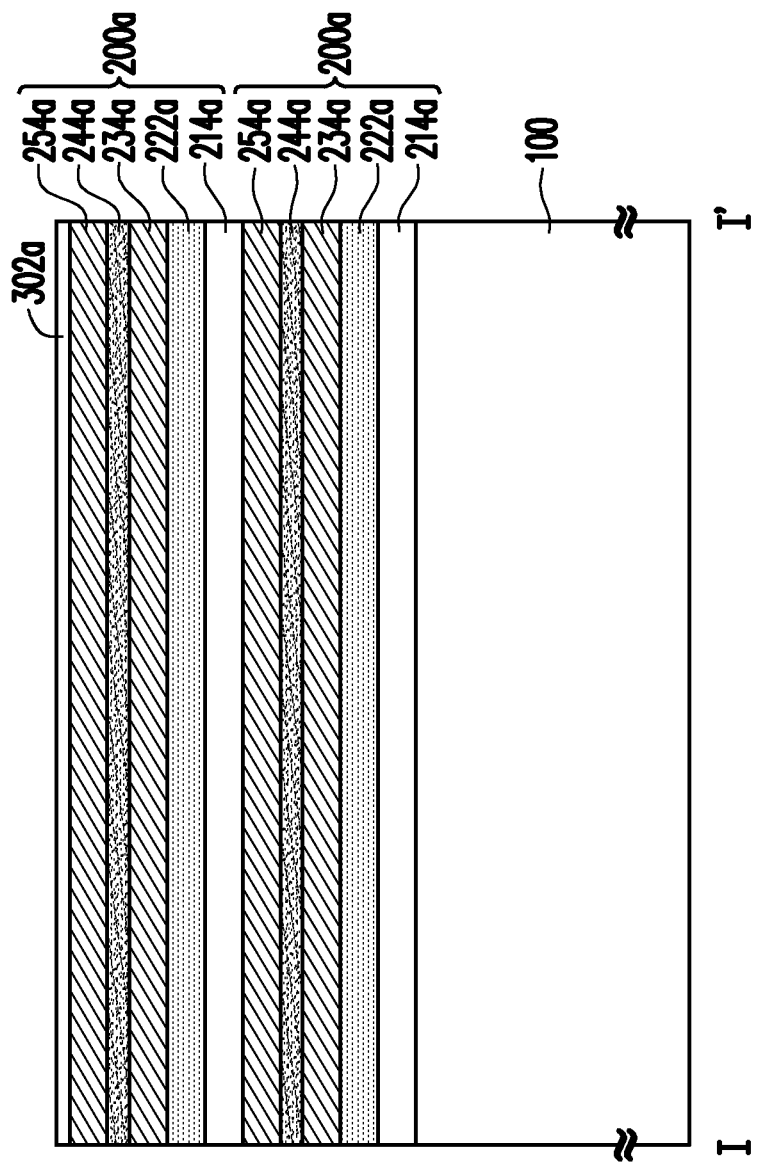
Figure 3D:
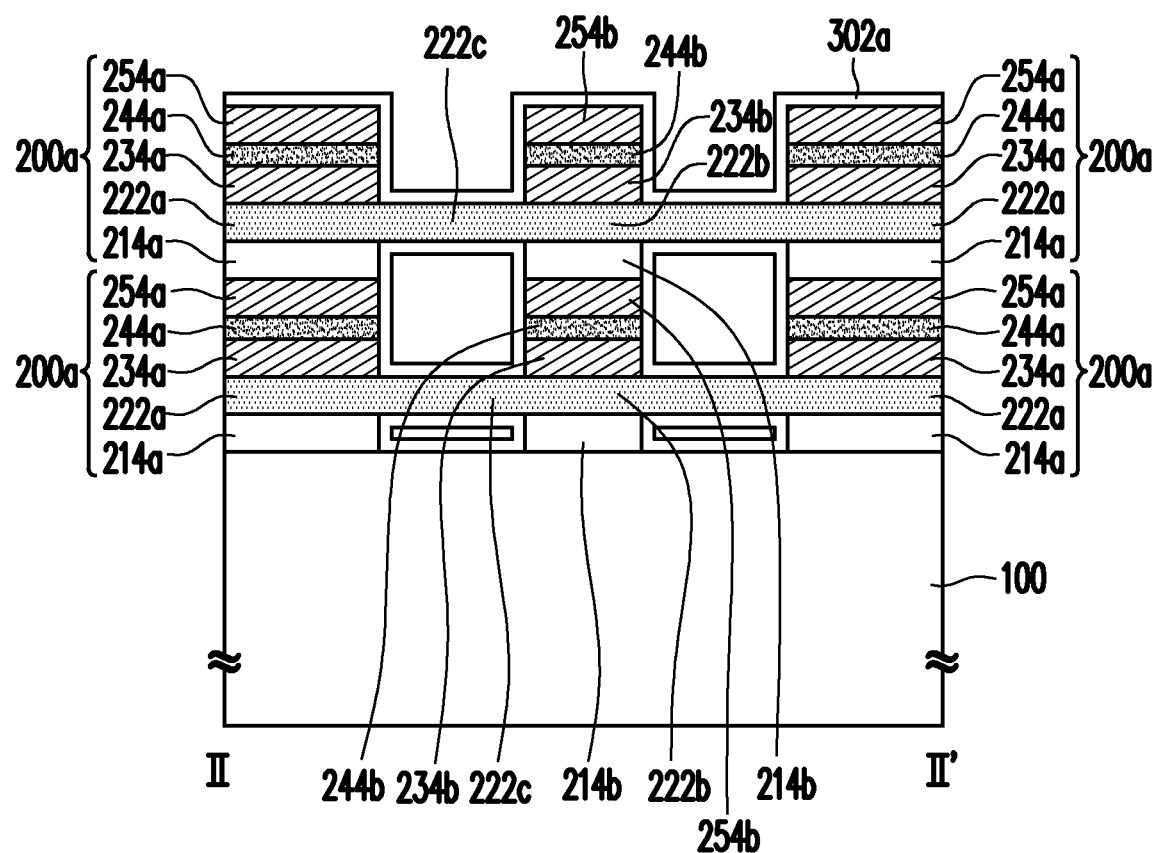

FIG. 1D is a perspective view illustrating one of various stages of a method of manufacturing a semiconductor device 10 in accordance with some embodiments of the disclosure. FIG. 2D is a cross-sectional view taken along line I-I' of FIG. 1D and FIG. 3D is a cross-sectional view taken along line II-II' of FIG. 1D. Referring to FIGS. 1D, 2D, and 3D, a gate dielectric material layer 302a is formed on the first film stacks 200a, the second film stacks 200b, the channels 222c, and the substrate 100. In some embodiments, the gate dielectric material layer 302a is formed to conformally cover the surfaces of the first film stacks 200a, the second film stacks 200b, the channels 222c, and the substrate 100. That is, the gate dielectric material layer 302a wraps around the channels 222c. In some embodiments, the gate dielectric material layer 302a includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric material layer 302a includes an interfacial layer (not shown) formed between the channels 222c and the dielectric material. The gate dielectric material layer 302a may be formed by CVD, ALD, or any suitable method.

Figure 1E:
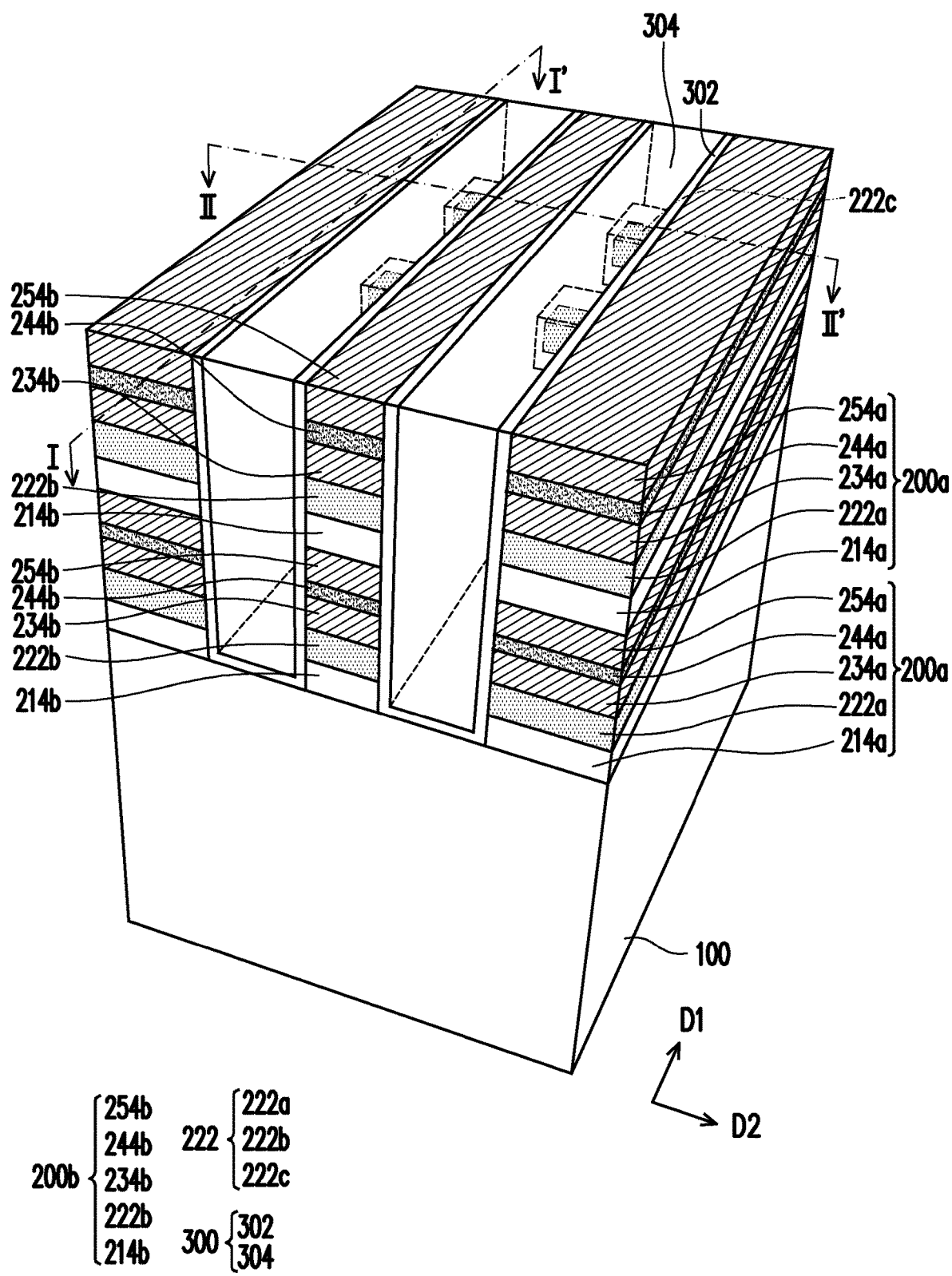
Figure 2E:
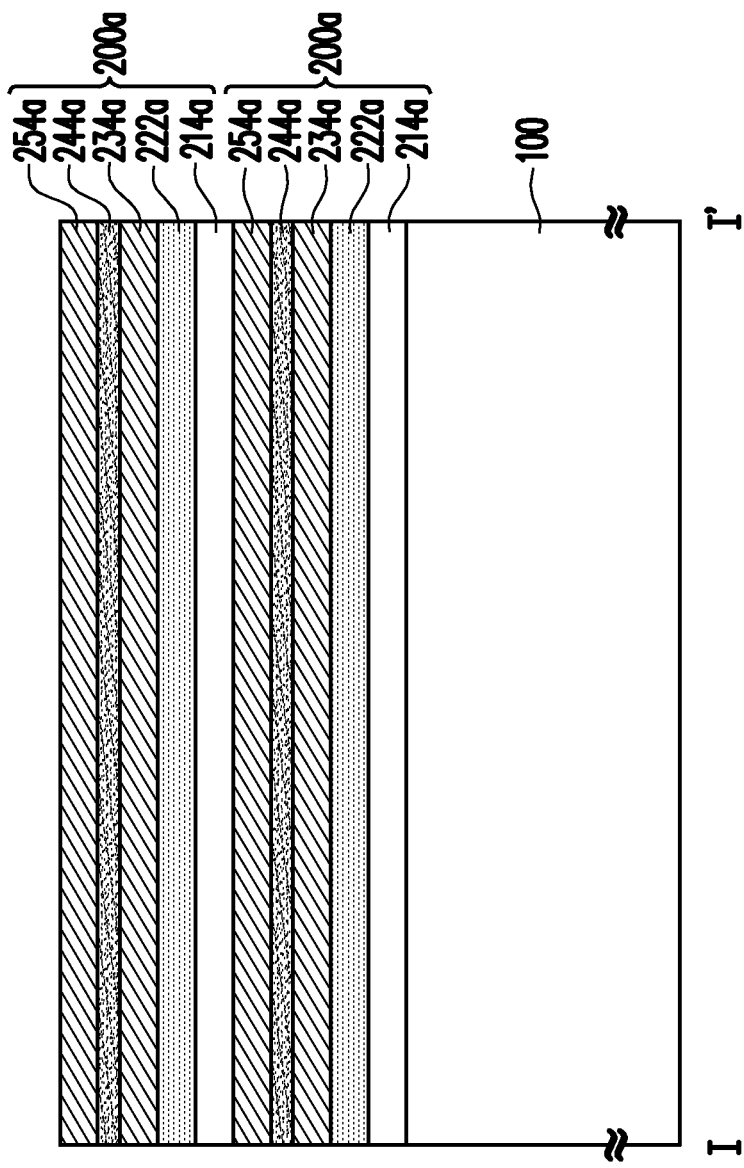
Figure 3E:
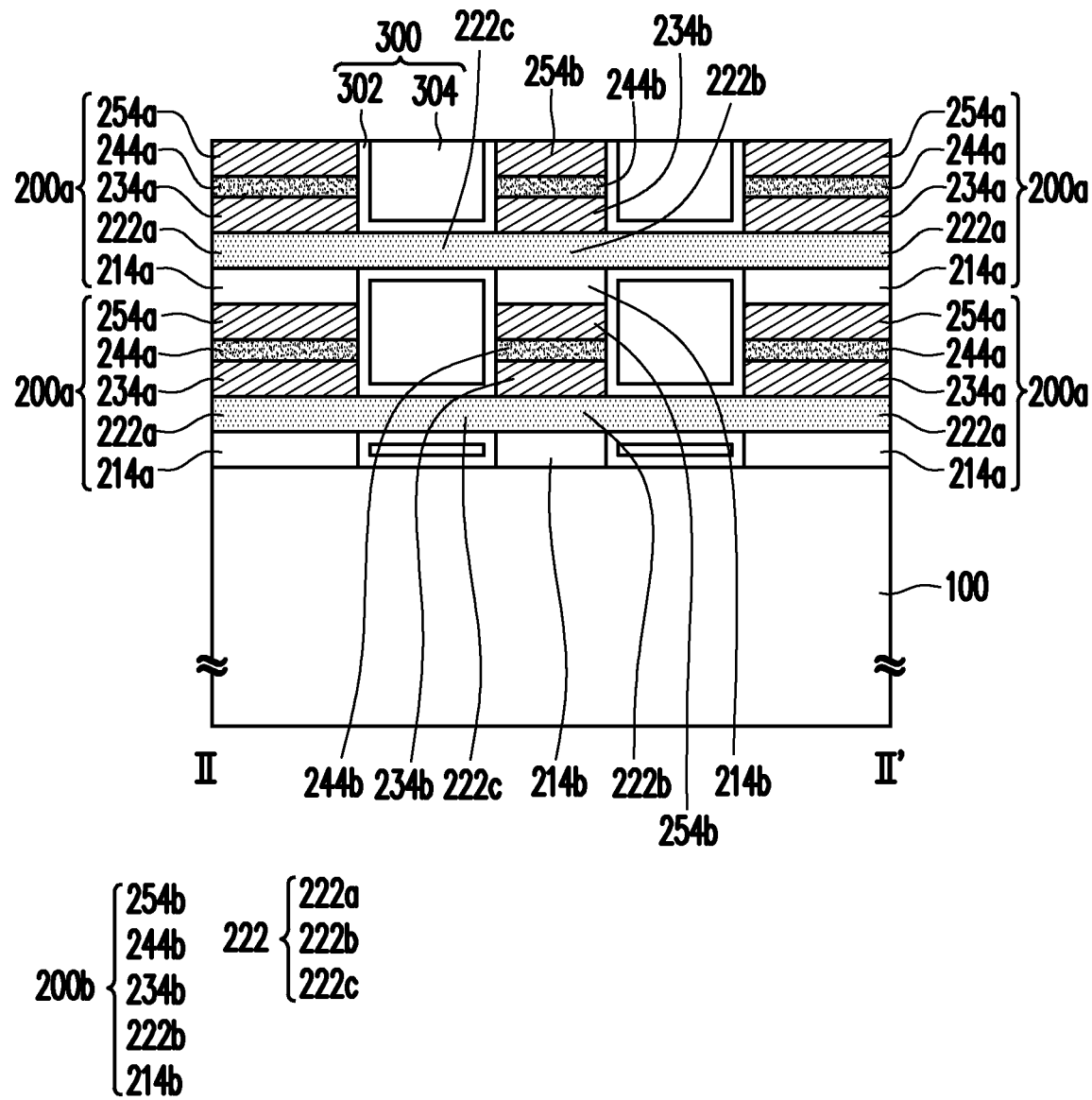

FIG. 1E is a perspective view illustrating one of various stages of a method of manufacturing a semiconductor device 10 in accordance with some embodiments of the disclosure. FIG. 2E is a cross-sectional view taken along line I-I' of FIG. 1E and FIG. 3E is a cross-sectional view taken along line II-II' of FIG. 1E. Referring to FIGS. 1E, 2E, and 3E, a gate stack 300 is formed to wrap around the channels 222c. In some embodiments, the gate stack 300 may be formed by the following steps. As mentioned above, the gate dielectric material layer 302a is formed to cover the first film stacks 200a, the second film stacks 200b, the channels 222c, and the substrate 100. Subsequently, a gate electrode material layer (not shown) is formed over the gate dielectric material layer 302a. For example, the gate electrode material layer is formed to fill in gaps between the first film stacks 200a and the second film stacks 200b. Meanwhile, the gate electrode material layer is also formed over top surfaces of the first film stacks 200a and top surfaces of the second film stacks 200b. In some embodiments, the gate electrode material layer includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode material layer may be formed by CVD, ALD, electro-plating, or other suitable method. After the gate electrode material layer is deposited, a planarization process is performed on the gate electrode material layer and the gate dielectric material layer 302a to expose the first film stacks 200a and the second film stacks 200b. For example, a portion of the gate electrode material layer and a portion of the gate dielectric material layer 302a are removed until top surfaces of the topmost first film stacks 200a and top surfaces of the topmost second film stacks 200b are exposed. The planarization process includes, for example, a mechanical polishing process, a chemical mechanical polishing process (CMP), an etching process, or the like. After the planarization process, the remaining gate dielectric material layer 302a forms gate dielectric layers 302 and the remaining gate electrode material layer forms gate electrodes 304. In some embodiments, each gate dielectric layer 302 and each gate electrode 304 may be collectively referred to as the gate stack 300.

In some embodiments, one or more work function adjustment layers (not shown) are interposed between the gate dielectric layer 302 and the gate electrode 304. The work function adjustment layers are made of a conductive material, such as a single layer of TiN, TaN, TaAlC, TiC, TaC, Co, Al, TiAl, HfTi, TiSi, TaSi or TiAlC, or a multilayer of two or more of these materials. For the n-type device, one or more of TaN, TaAlC, TiN, TiC, Co, TiAl, HfTi, TiSi and TaSi is used as the work function adjustment layer, and for the p-type device, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process.

As illustrated in FIG. 1E and FIG. 3E, the gate stacks 300 are sandwiched between the first film stacks 200a and the adjacent second film stacks 200b. In some embodiments, a first portion of the gate dielectric layer 302 is sandwiched between the gate electrode 304 and the first film stacks 200a. On the other hand, a second portion of the gate dielectric layer 302 is sandwiched between the gate electrode 304 and the second film stacks 200b. Moreover, a third portion of the gate dielectric layer 302 is sandwiched between the gate electrode 304 and the channels 222c. In some embodiments, the channels 222c (i.e. the second portion of the nanosheet 222) penetrate through the gate stacks 300. For example, the gate stacks 300 wraps around the channels 222c. Since the gate stacks 300 wrap around the channels 222c on four sides, the subsequently formed transistor may be referred to as gate all around (GAA) transistor.

Figure 1F:
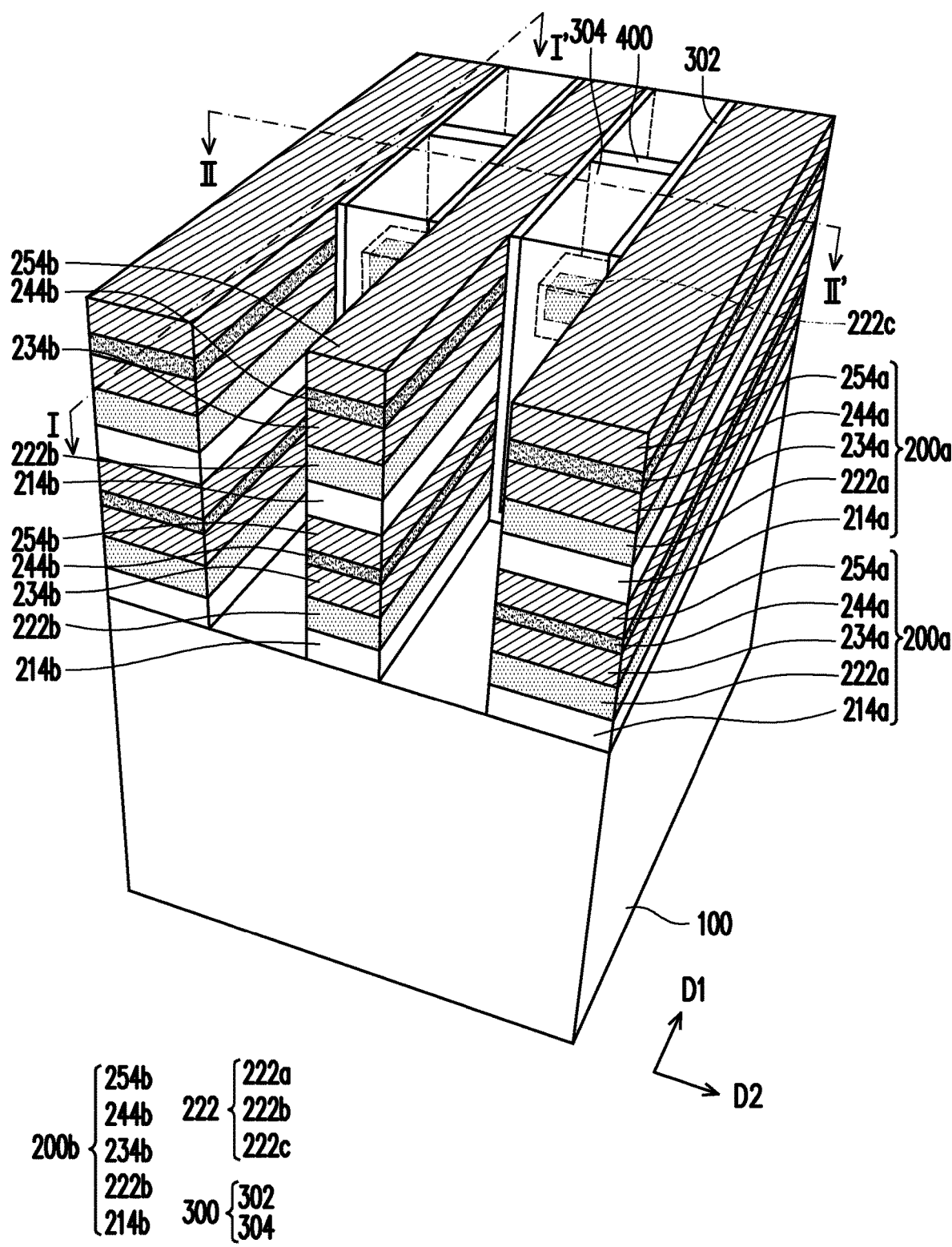
Figure 2F:
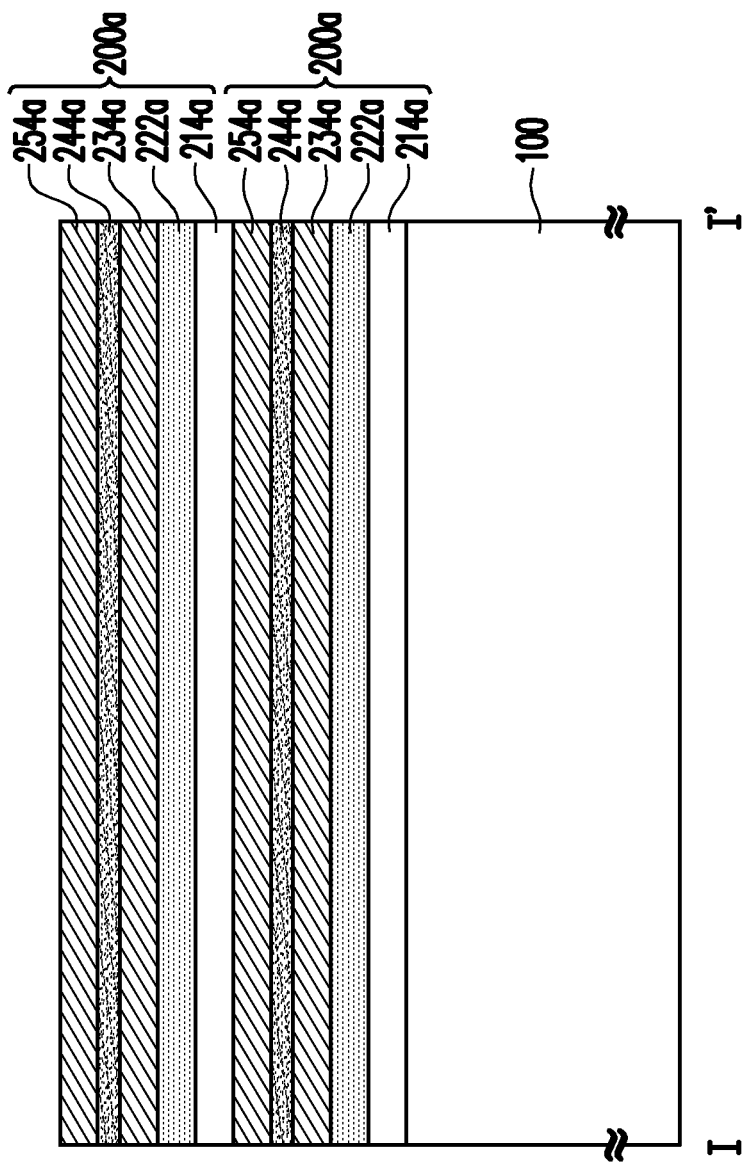
Figure 3F:
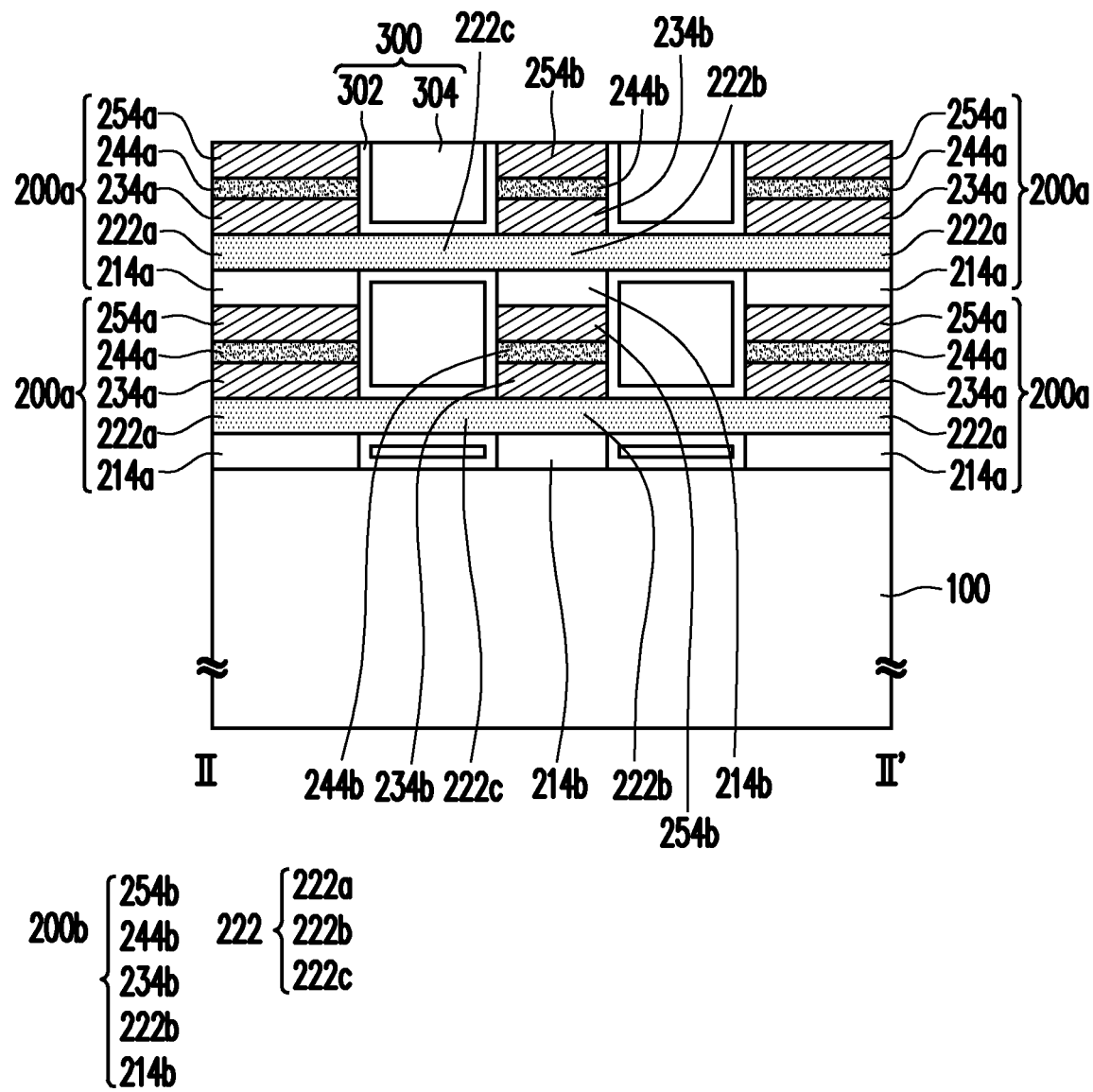

FIG. 1F is a perspective view illustrating one of various stages of a method of manufacturing a semiconductor device 10 in accordance with some embodiments of the disclosure. FIG. 2F is a cross-sectional view taken along line I-I' of FIG. 1F and FIG. 3F is a cross-sectional view taken along line II-II' of FIG. 1F. Referring to FIGS. 1F, 2F, and 3F, a portion of each gate stack 300 is removed. For example, a portion of the gate dielectric layer 302 and a portion of the gate electrode 304 in each gate stack 300 are removed to partially expose sidewalls of the first film stacks 200a and sidewalls of the second film stacks 200b. Meanwhile, a portion of the gate electrode 304 in each gate stack 300 is further removed to separate each gate electrode 304 into multiple gate electrodes 304. That is, a plurality of gaps is formed between the separated gate electrodes 304. In some embodiments, the gate dielectric layer 302 and the gate electrode 304 are removed through a photolithography and/or an etching process. In some embodiments, the etching process includes an isotropic etching process or an anisotropic etching process. For example, the etching process includes a wet etching process, a dry etching process, a combination thereof, or the like. Thereafter, an isolation layer 400 is filled into the gaps to electrically isolate the separated gate electrodes 304. A material of the isolation layer 400 includes silicon oxide, silicon nitride, silicon oxynitride, a spin-on dielectric material, or a low-k dielectric material. Herein, the low-k dielectric materials are generally dielectric materials having a dielectric constant lower than 3.9. The isolation layer 400 may be formed by spin-on coating, CVD, PECVD, FCVD, HDP-CVD, SACVD, PVD, or ALD. It should be noted that although four separated gate stacks 300 are illustrated in FIG. 1F, the disclosure is not limited thereto. In some alternative embodiments, the number of the gate stacks 300 may be adjusted based on demand.

Figure 1G:
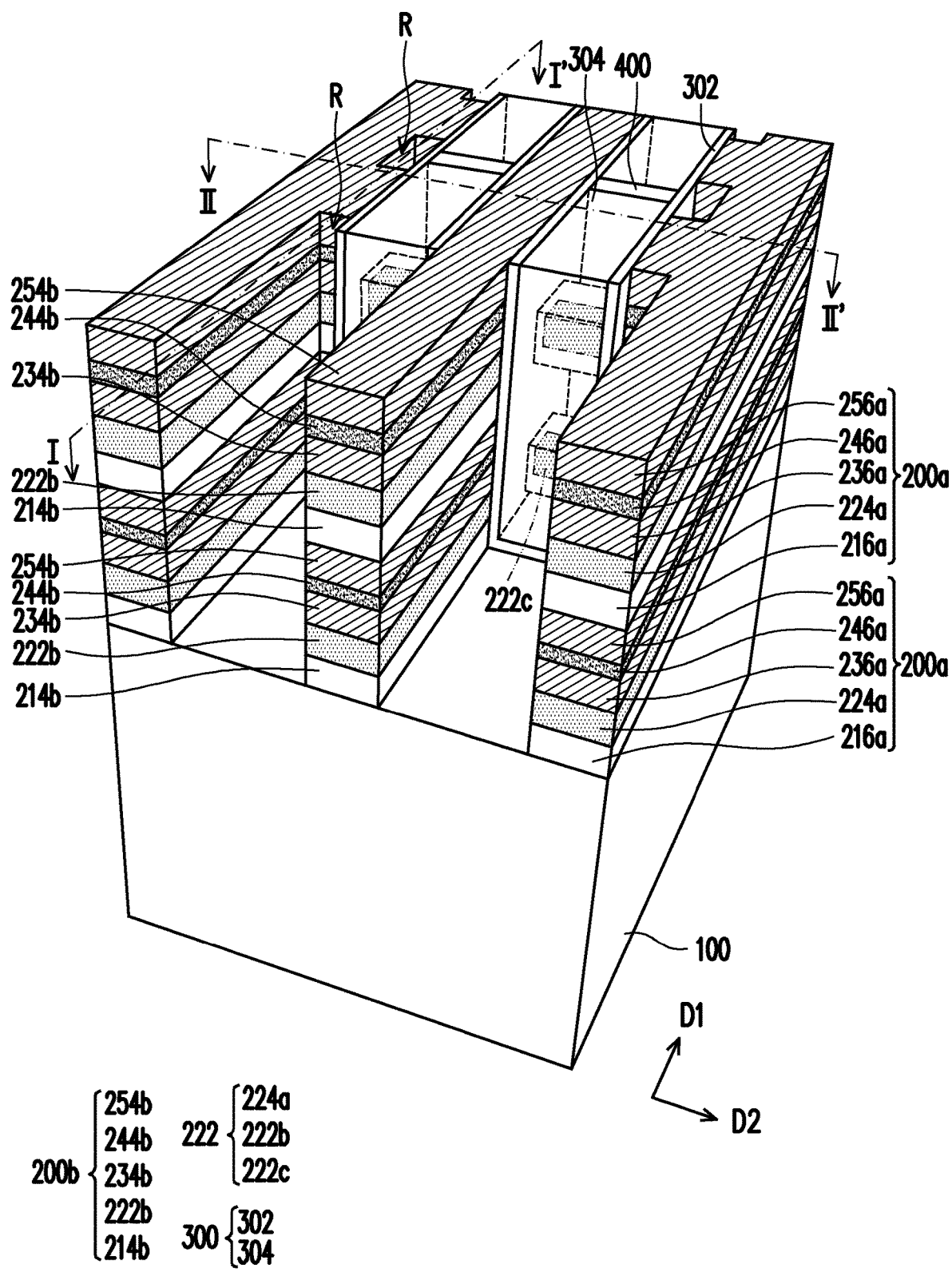
Figure 3G:
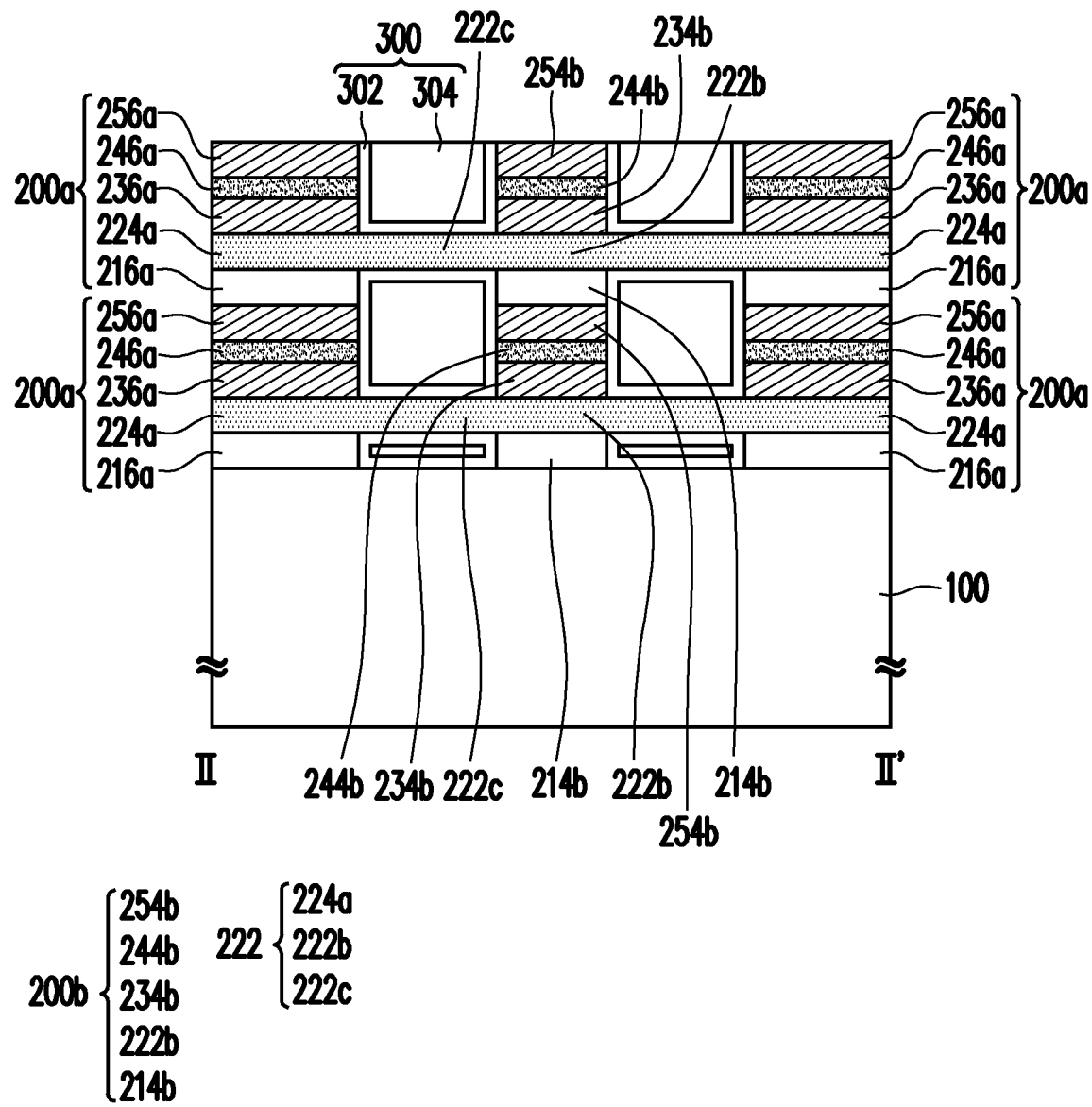

FIG. 1G is a perspective view illustrating one of various stages of a method of manufacturing a semiconductor device 10 in accordance with some embodiments of the disclosure. FIG. 2G is a cross-sectional view taken along line I-I' of FIG. 1G and FIG. 3G is a cross-sectional view taken along line II-II' of FIG. 1G. Referring to FIGS. 1F-1G, 2F-2G, and 3F-3G, a portion of each first film stack 200a is removed to form recesses R in the first film stack 200a. For example, the isolation layers 214a, the semiconductor layers 222a, the first metal layers 234a, the storage layers 244a, and the second metal layers 254a of the first film stacks 200a are patterned to respectively form the isolation layers 216a, the semiconductor layers 224a, the first metal layers 236a, the storage layers 246a, and the second metal layers 256a. In some embodiments, the isolation layers 214a, the semiconductor layers 222a, the first metal layers 234a, the storage layers 244a, and the second metal layers 254a may be patterned through a photolithography and/or an etching process. In some embodiments, the etching process includes an isotropic etching process or an anisotropic etching process. For example, the etching process includes a wet etching process, a dry etching process, a combination thereof, or the like. In some embodiments, the recesses R are located aside the gate stacks 300. For example, the recesses R partially expose sidewalls of the gate stacks 300 facing the first film stacks 200a. In some embodiments, after forming the recesses R, the first film stacks 200a exhibit a Π shape from a top view. In some embodiments, the recesses R are formed to penetrate through the first film stacks 200a. In some embodiments, shapes of the isolation layers 216a, the semiconductor layers 224a, the first metal layers 236a, the storage layers 246a, and the second metal layers 256a are identical. That is, contours of the isolation layers 216a, the semiconductor layers 224a, the first metal layers 236a, the storage layers 246a, and the second metal layers 256a are aligned, and the recesses R have substantially straight sidewalls.

Figure 1H:
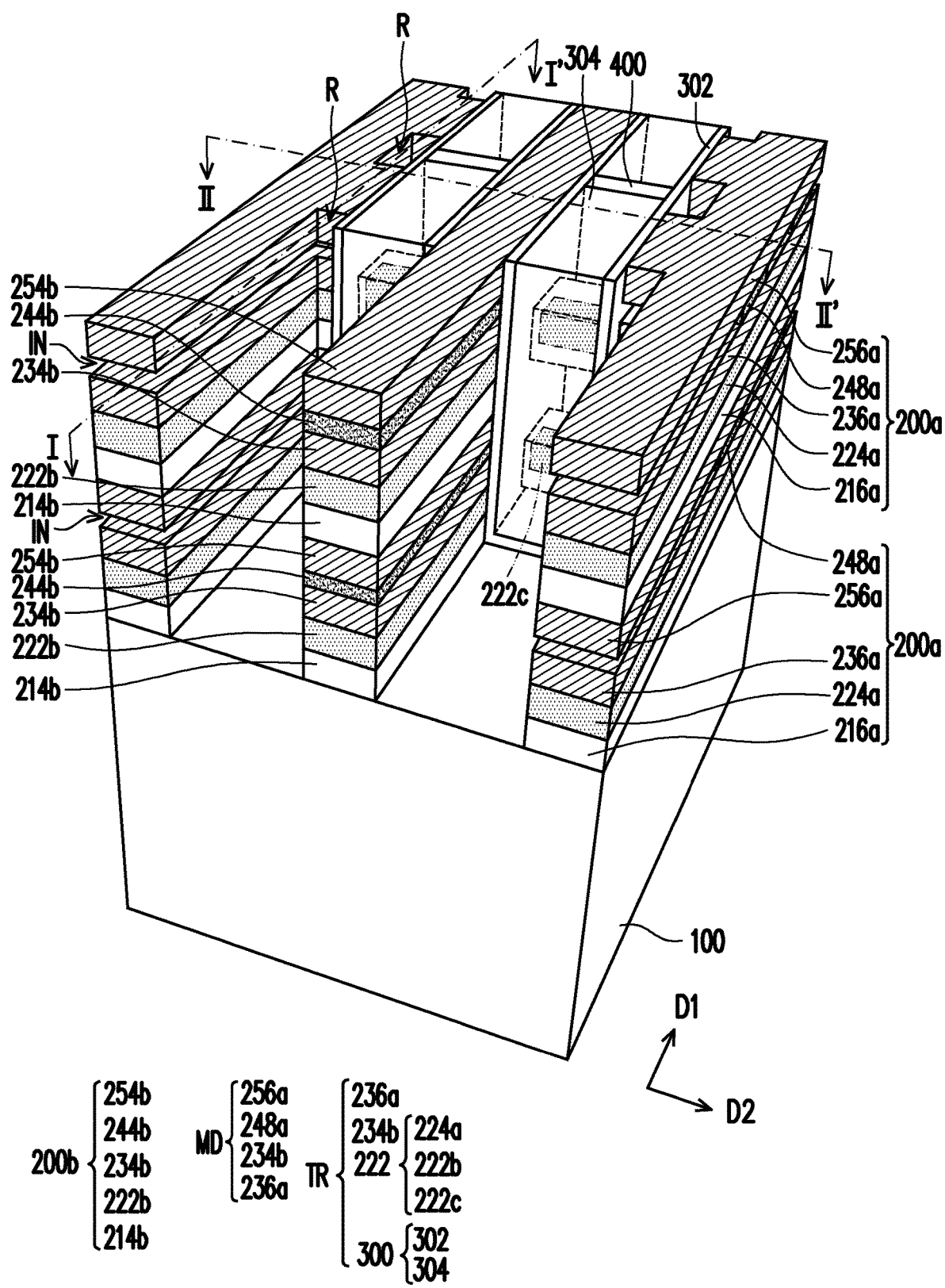
Figure 3H:
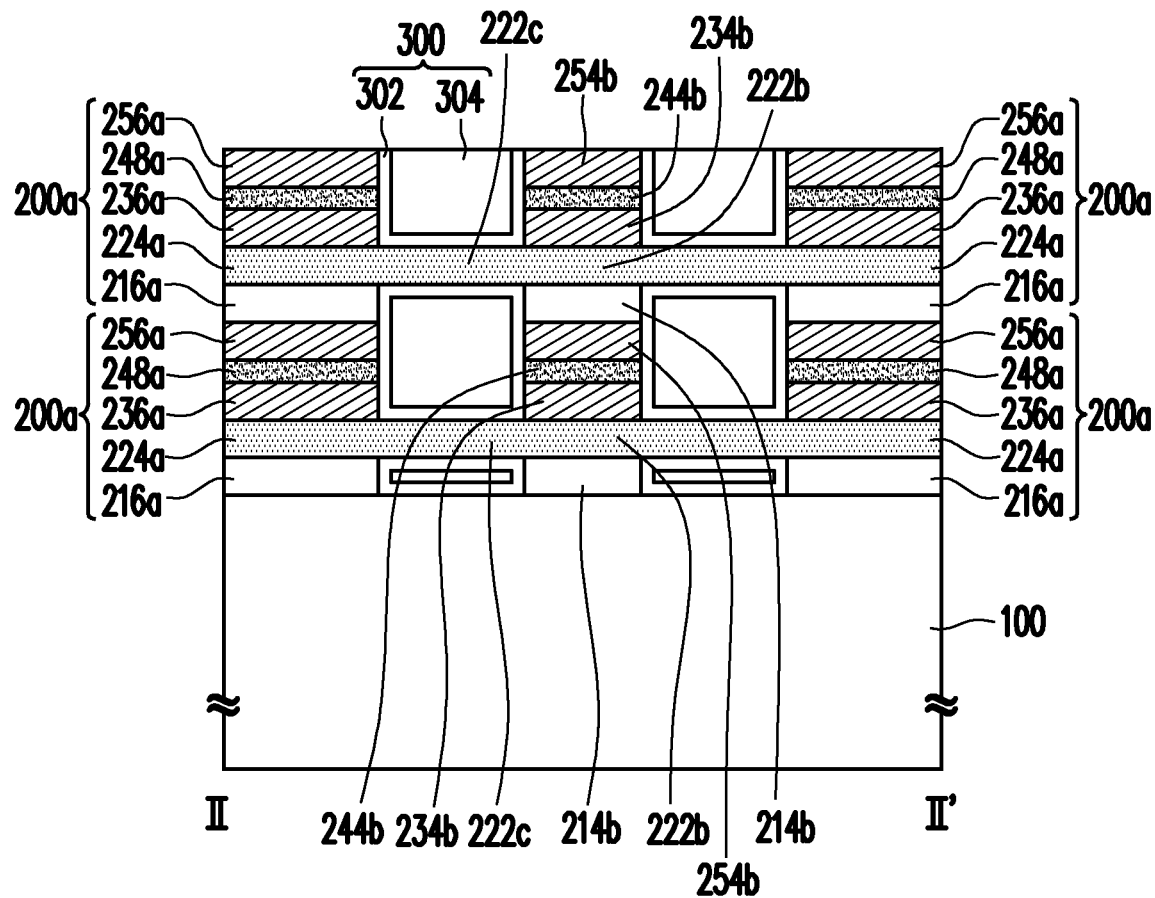
Figure 31:
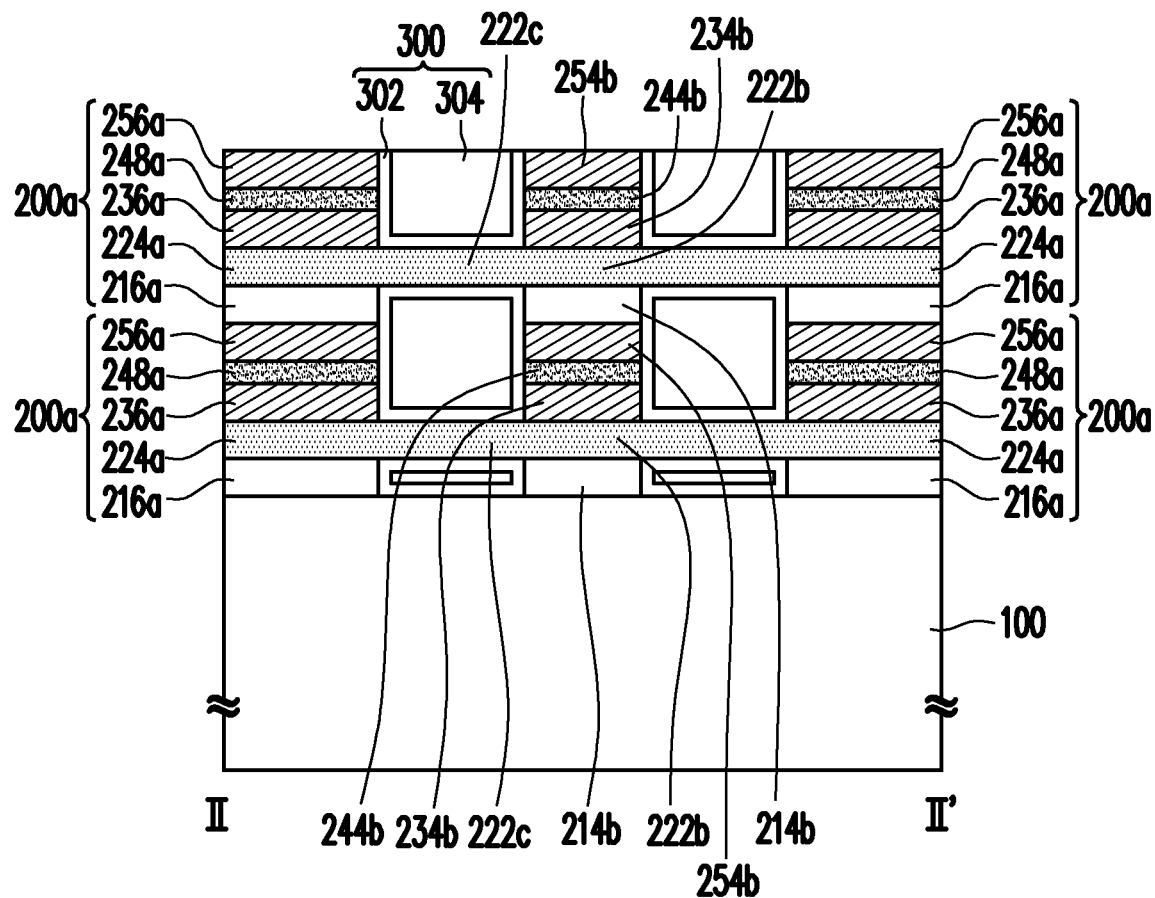

FIG. 1H is a perspective view illustrating one of various stages of a method of manufacturing a semiconductor device 10 in accordance with some embodiments of the disclosure. FIG. 2H is a cross-sectional view taken along line I-I' of FIG. 1H and FIG. 3H is a cross-sectional view taken along line II-II' of FIG. 1H. Referring to FIGS. 1G-1H, 2G-2H, and 3G-3H, a portion of each storage layer 246a in the first film stacks 200a is removed laterally to form indentations IN in the first film stacks 200a. For example, each storage layer 246a is partially removed from a lateral direction to form storage layer 248a. In some embodiments, the storage layers 246a may be partially removed through an etching process. In some embodiments, the etching process includes an isotropic etching process or an anisotropic etching process. For example, the etching process includes a wet etching process, a dry etching process, a combination thereof, or the like.

Figure 5A:
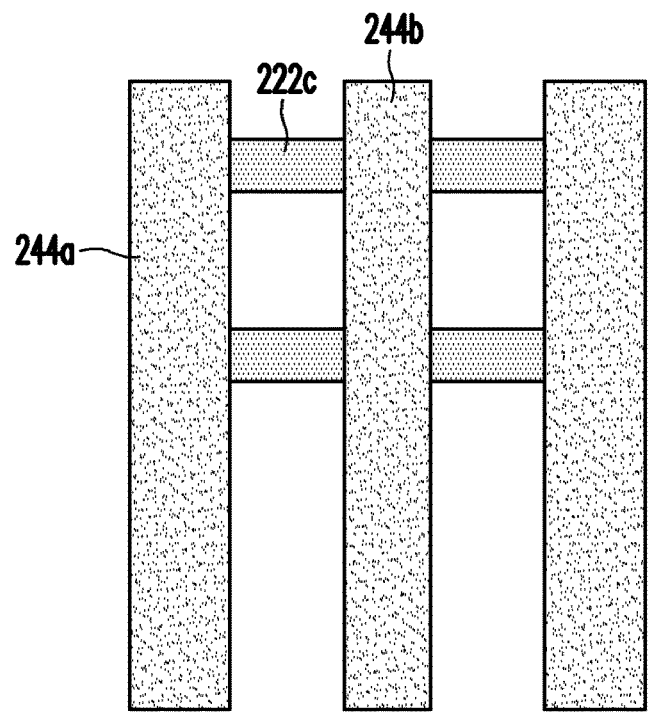
FIG. 5A to FIG. 5C are schematic top views illustrating various stages of the method of manufacturing the semiconductor device in FIG. 1F to FIG. 1H.
Figure 5B:
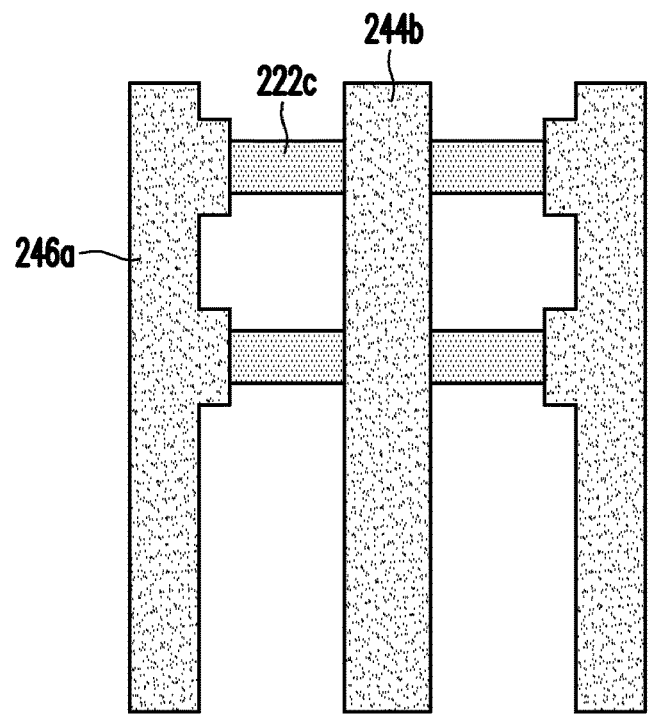
Figure 5C:
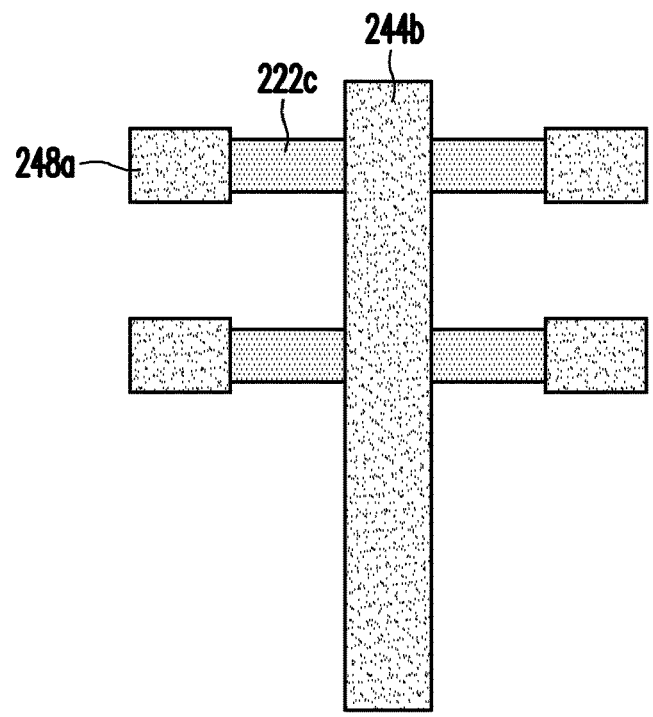

In some embodiments, after the etching process, a shape of the storage layers 248a is different from the shapes of the isolation layers 216a, the semiconductor layers 224a, the first metal layers 236a, and the second metal layers 256a. The shapes of the storage layers 248a in various stages are shown in FIG. 5A to FIG. 5C. FIG. 5A to FIG. 5C are schematic top views illustrating various stages of the method of manufacturing the semiconductor device in FIG. 1F to FIG. 1H. For simplicity, elements other than the storage layers 244a, 246a, 248a, 244b and the channels 222c are omitted in FIG. 5A to FIG. 5C. It should be noted that FIG. 5A to FIG. 5C respectively correspond to the steps illustrated in FIG. 1F to FIG. 1H. Referring to FIG. 5A, in the step illustrated in FIG. 1F, each storage layer 244a exhibits a strip-like shape from the top view. Referring to FIG. 5B, in the step illustrated in FIG. 1G, each storage layer 246a exhibits a Π shape from the top view. Referring to FIG. 5C, in the step illustrated in FIG. 1H, each storage layer 248a exhibits a rectangular shape from the top view.

As illustrated in FIG. 1H and FIG. 3H, memory devices MD and transistors TR are formed during this stage. In some embodiments, the memory devices MD are located aside the transistors TR. In some embodiments, each memory device MD includes the first metal layer 236a, the storage layer 248a, and the second metal layer 256a in the first film stack 200a and the first metal layer 234b in the second film stack 200b. In some embodiments, the second metal layer 256a forms a top electrode of the memory device MD. Meanwhile, the storage layer 248a forms a storage layer of the memory device MD. On the other hand, the first metal layer 236a and the first metal layer 234b collectively form a bottom electrode of the memory device MD. In some embodiments, the first metal layer 236a of the first film stack 200a may be referred to as a first portion of the bottom electrode, and the first metal layer 234b of the second film stack 200b may be referred to as a second portion of the bottom electrode. In some embodiments, the storage layer (i.e. the storage layer 248a) is sandwiched between the top electrode (i.e. the second metal layer 256a) and the bottom electrode (i.e. the first metal layer 236a) of the memory device MD. As illustrated in FIG. 3H, the first portion (i.e. the first metal layer 236a) of the bottom electrode is spatially apart from the second portion (i.e. the first metal layer 234b) of the bottom electrode. That is, the first portion of the bottom electrode is spatially separated from the second portion of the bottom electrode by the gate stack 300. In some embodiments, the first portion and the second portion of the bottom electrode may be electrically connected to each other through the nanosheet 222. For example, since the second portion (i.e. the semiconductor layers 224a, 222b) of the nanosheet 222 is located directly underneath the bottom electrode (i.e. the first metal layer 236a and the first metal layer 234b) and is directly in contact with the bottom electrode, the second portion (i.e. the semiconductor layers 224a, 222b) of the nanosheet 222 and the first portion (i.e. the channel 222c) of the nanosheet 222 are able to create an electrical path between the first portion and the second portion of the bottom electrode once the transistor TR is turned on.

In some embodiments, the first metal layer 236a, the storage layer 248a, and the second metal layer 256a in the first film stack 200a may be collectively referred to as a first portion of the memory device MD. Meanwhile, the first metal layer 234b in the second film stack 200b may be referred to as a second portion of the memory device MD. That is, the first portion of the memory device MD includes the top electrode (i.e. the second metal layer 256a), the storage layer (i.e. the storage layer 248a), and the first portion (i.e. the first metal layer 236a) of the bottom electrode. On the other hand, the second portion of the memory device MD includes the second portion (i.e. the first metal layer 234b) of the bottom electrode. As illustrated in FIG. 3H, a portion of the gate stack 300 is sandwiched between the first portion and the second portion of the memory device MD. That is, the first portion of the memory device MD is spatially separated from the second portion of the memory device MD. In some embodiments, the second portion (i.e. the semiconductor layers 224a, 222b) of the nanosheet 222 is located directly underneath the first portion and the second portion of the memory device MD. In some embodiments, each memory device MD may be referred to as a Resistive Random Access Memory (RRAM) cell.

In some embodiments, the transistors TR are formed aside the memory devices MD. In some embodiments, each transistor TR includes the gate stack 300, the nanosheet 222, the first metal layer 236a, and the first metal layer 234b. In some embodiments, the first metal layer 236a may be referred to as the drain of the transistor TR while the first metal layer 234b may be referred to as the source of the transistor TR. In other words, the first portion (i.e. the first metal layer 246a) of the bottom electrode of the memory device MD may serve as the drain of the transistor TR while the second portion (i.e. the first metal layer 234b) of the bottom electrode of the memory device MD may serve as the source of the transistor TR. As illustrated in FIG. 3H, the channel 222c of the nanosheet 222 penetrates through the gate stack 300. Meanwhile, the drain (i.e. the first metal layer 236a) and the source (i.e. the first metal layer 234b) are respectively disposed on two opposite sides of the gate stack 300. When a voltage is applied to the gate electrode 304 and the transistor TR is turned on, the electrons in the source (i.e. the first metal layer 234b) may travel through the semiconductor layers 224a, 222b and channel 222c to arrive at the drain (i.e. the first metal layer 236a). In some embodiments, the gate electrode 304 is spatially separated from the memory device MD and the nanosheet 222 by the gate dielectric layer 302. As illustrated in FIG. 3H, a first portion of the gate stack 300 is sandwiched between the first portion (i.e. the first metal layer 236a, the storage layer 248a, and the second metal layer 256a) and the second portion (i.e. the first metal layer 234b) of the memory device MD. On the other hand, a second portion of the gate stack 300 is sandwiched between the isolation layer 216a and the isolation layer 214b.

As mentioned above, the memory devices MD are formed aside the transistors TR. In addition, the bottom electrode of the memory device MD serves as the source and the drain of the transistors TR. In other words, the memory devices MD and the transistors TR are integrated together. That is, both of the memory devices MD and the transistors TR are manufactured during the front end of line (FEOL) stage. Since the memory devices MD are integrated with the transistors TR, the memory density in the subsequently formed semiconductor device 10 may be sufficiently enhanced and the adoption of through semiconductor vias (TSV) in the conventional RRAM may be omitted. In other words, high-density memory applications may be realized with lower fabrication cost by the subsequently formed semiconductor device 10.

Figure 1I:
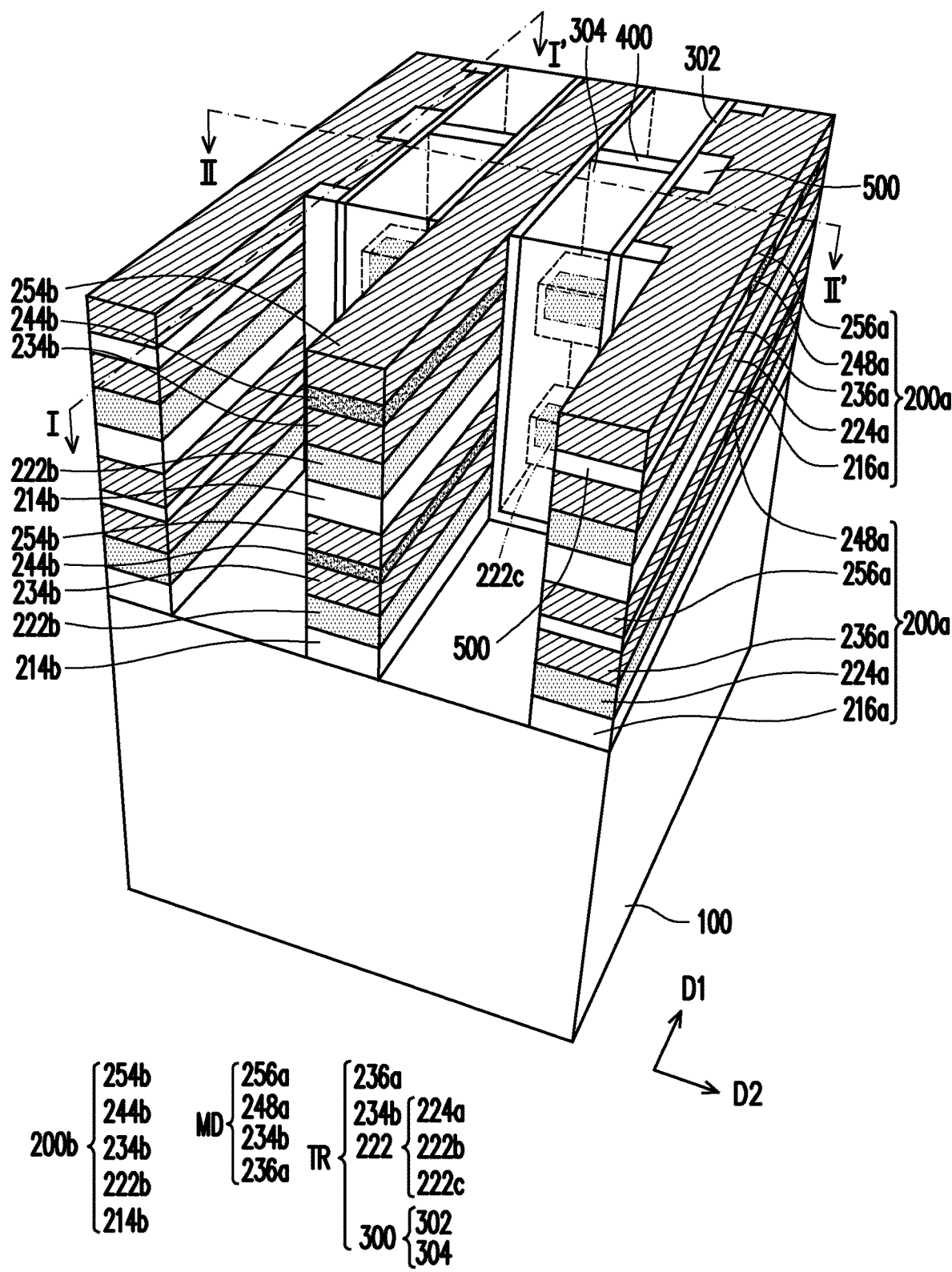
Figure 2I:
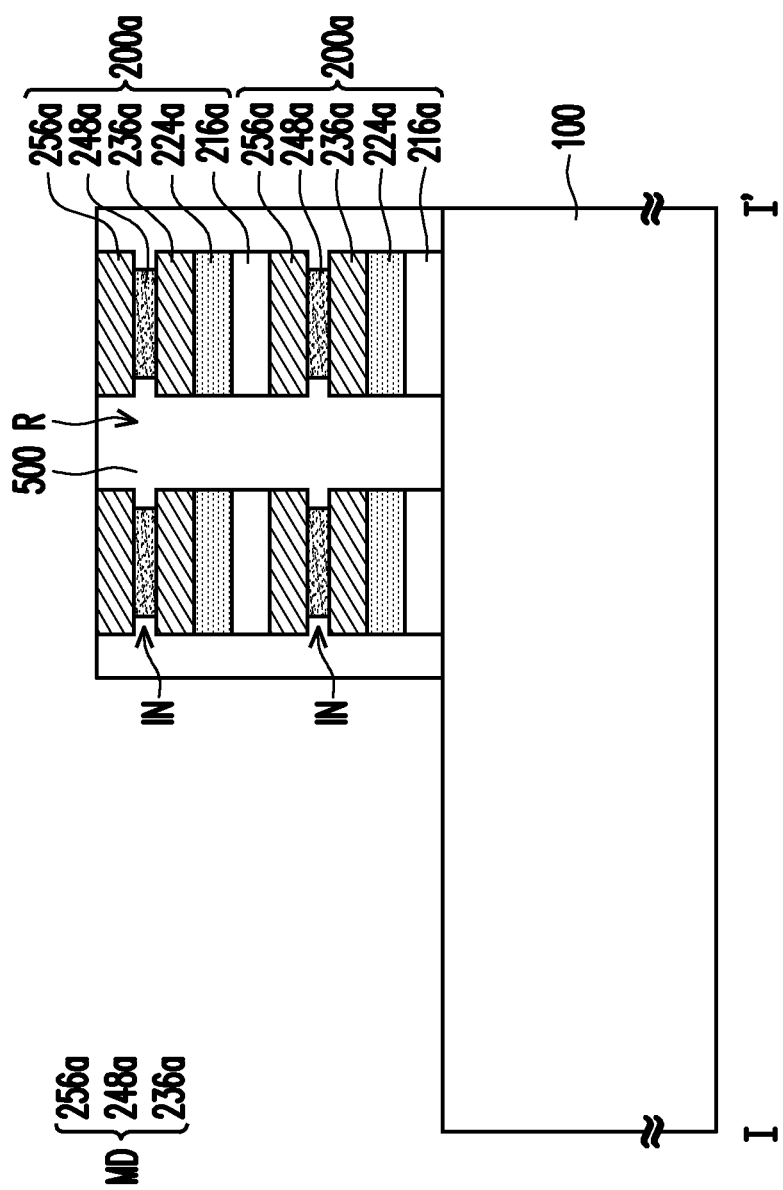

FIG. 1I is a perspective view illustrating one of various stages of a method of manufacturing a semiconductor device 10 in accordance with some embodiments of the disclosure. FIG. 2I is a cross-sectional view taken along line I-I' of FIG. 1I and FIG. 3I is a cross-sectional view taken along line II-II' of FIG. 1I. Referring to FIGS. 1H-1I, 2H-2I, and 3H-3I, a second isolation material layer fills the indentations IN and the recesses R to form isolation layers 500. In some embodiments, a material of the isolation layers 500 is the same as the material of the isolation material layers 216a. However, the disclosure is not limited thereto. In some alternative embodiments, the material of the isolation layers 500 may be different from the material of the isolation material layers 216a. The material of the isolation layers 500 includes silicon oxide, silicon nitride, silicon oxynitride, a spin-on dielectric material, or a low-k dielectric material. Herein, the low-k dielectric materials are generally dielectric materials having a dielectric constant lower than 3.9. The isolation layers 500 may be formed by spin-on coating, CVD, PECVD, FCVD, HDP-CVD, SACVD, PVD, or ALD. As illustrated in FIG. 1I, top surfaces of the isolation layers 500 and top surfaces of the gate stacks 300 are coplanar. Meanwhile, a side surface of the isolation layers 500 and a side surface of the gate stacks 300 are also coplanar. In some embodiments, since the isolation layers 500 fill the indentations IN of the first film stacks 200a, at least a portion of each isolation layer 500 is embedded in the first film stacks 200a.

Figure 1J:
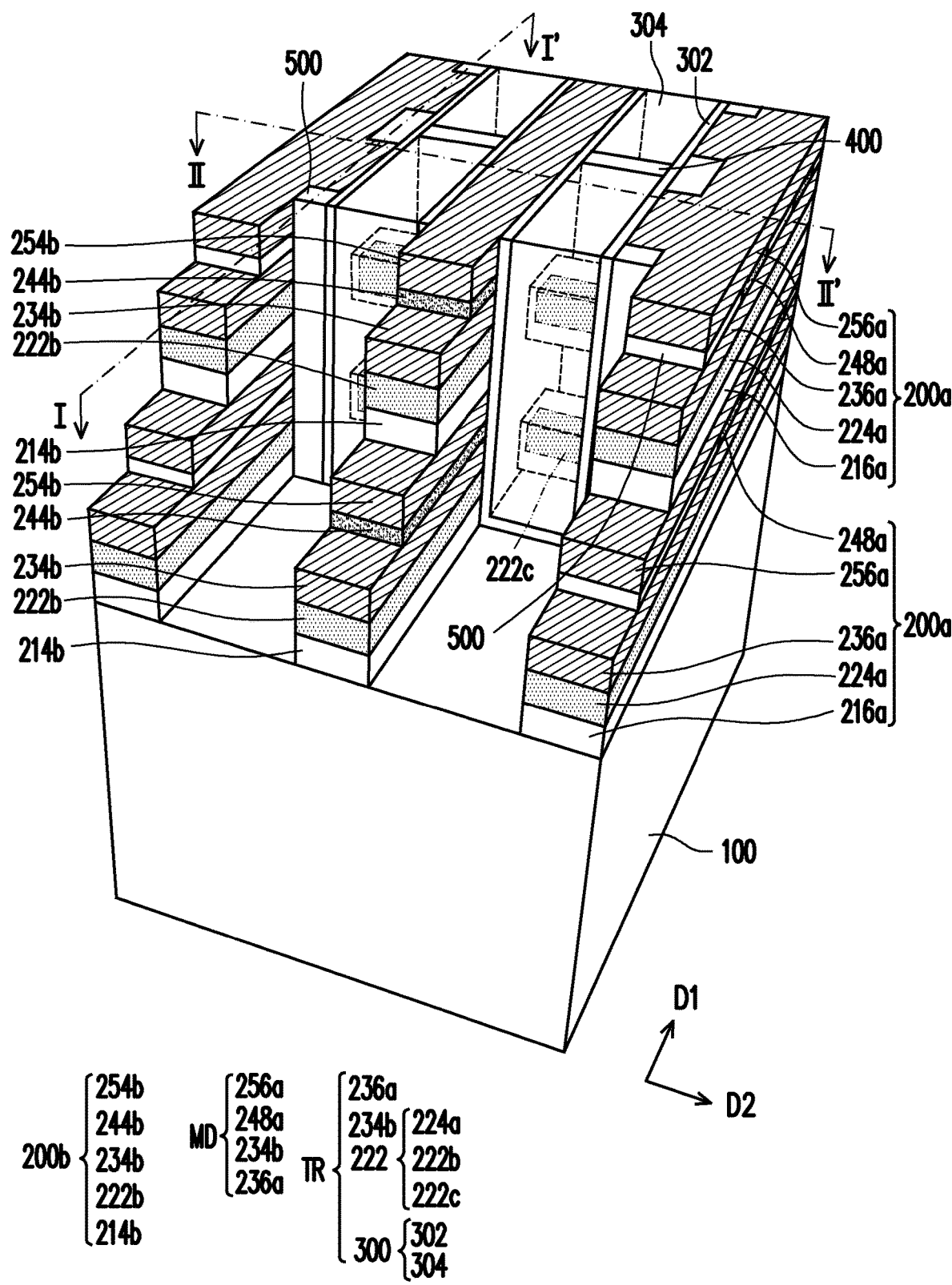
Figure 2J:
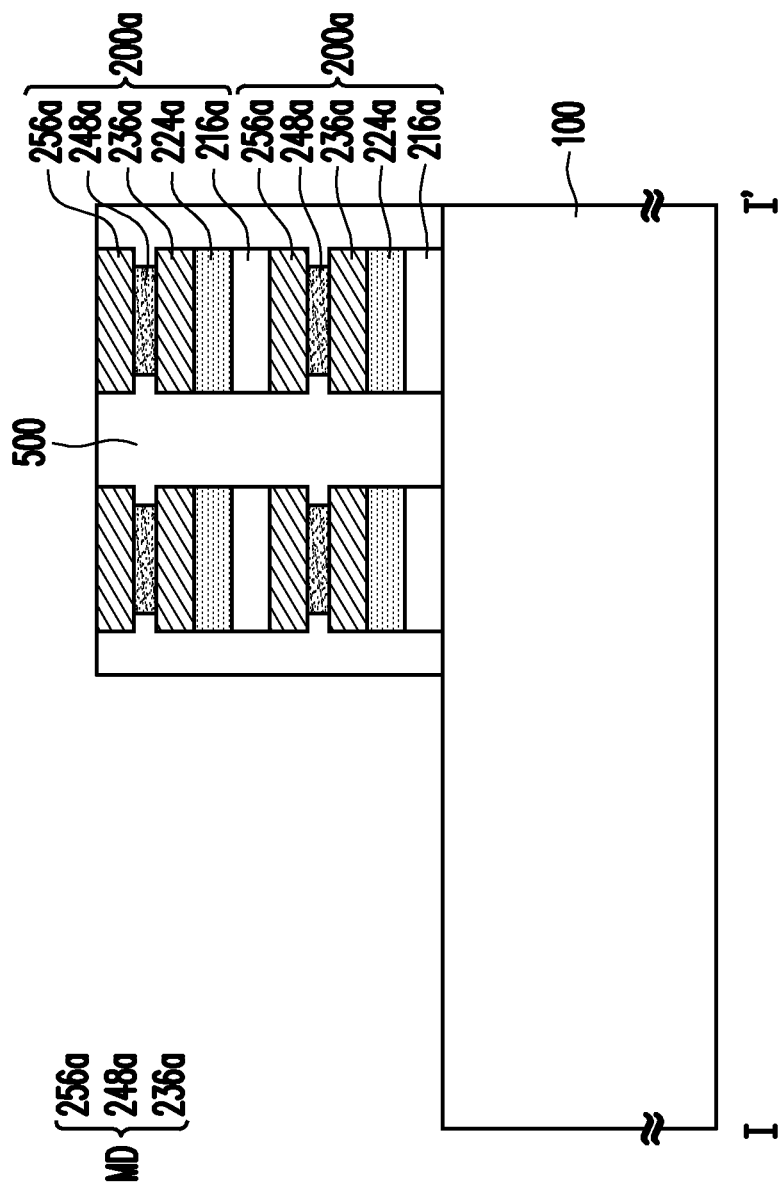
Figure 3J:
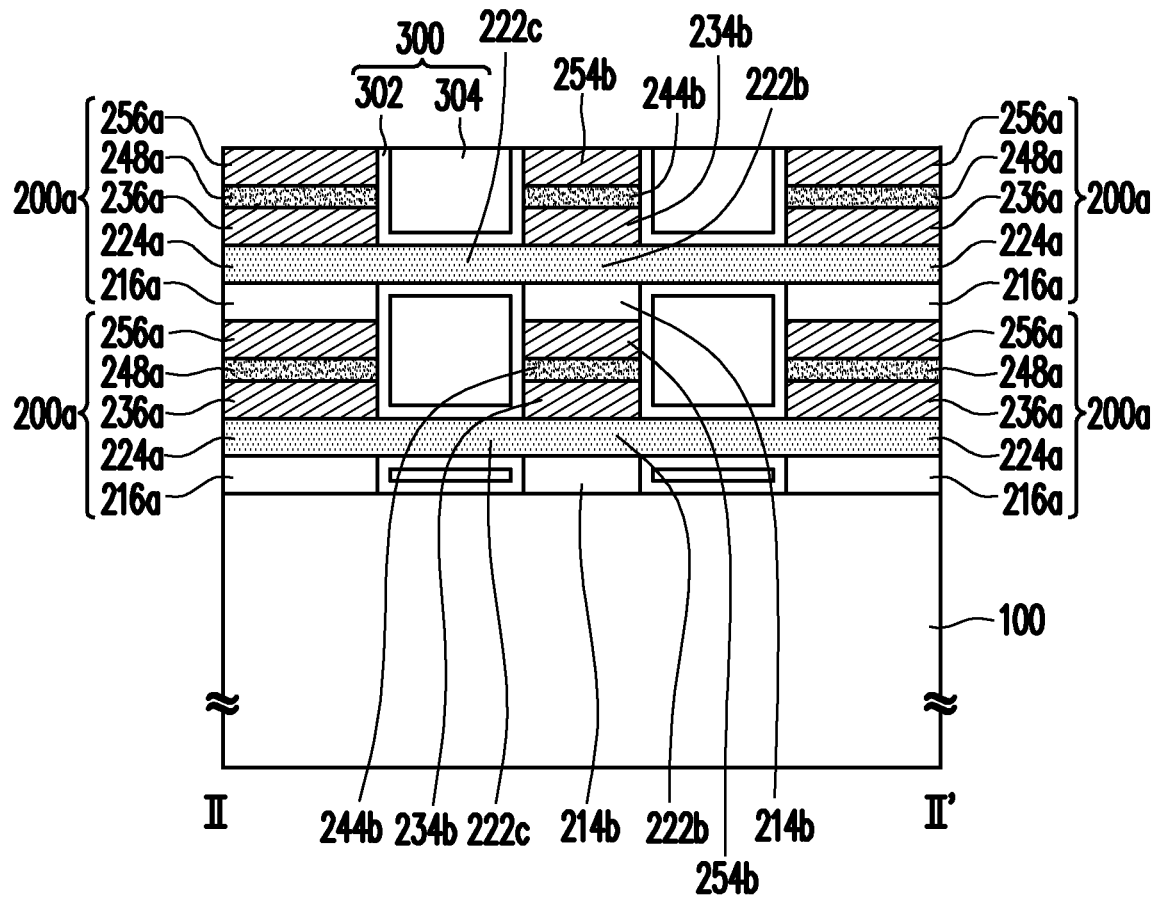

FIG. 1J is a perspective view illustrating one of various stages of a method of manufacturing a semiconductor device 10 in accordance with some embodiments of the disclosure. FIG. 2J is a cross-sectional view taken along line I-I' of FIG. 1J and FIG. 3J is a cross-sectional view taken along line II-II' of FIG. 1J. Referring to FIGS. 1I-1J, 2I-2J, and 3I-3J, the first film stacks 200a, the second film stacks 200b, and the isolation layer 500 embedded in the first film stacks 200a are patterned to form staircase-shaped structures. In some embodiments, these layers may be patterned through a photolithography and/or an etching process. In some embodiments, the etching process includes an isotropic etching process or an anisotropic etching process. For example, the etching process includes a wet etching process, a dry etching process, a combination thereof, or the like.

In some embodiments, the second metal layer 256a and the isolation layer 500 embedded in the first film stack 200a are patterned simultaneously. In other words, the second metal layer 256a and the isolation layer 500 within the same first film stack 200 have a same length along the first direction D1. On the other hand, the first metal layer 236a, the semiconductor layer 224a, and the isolation layer 216a are patterned simultaneously. In other words, the first metal layer 236a, the semiconductor layer 224a, and the isolation layer 216a within the same first film stack 200a have a same length along the first direction D1. In some embodiments, the second metal layer 254b and the storage layer 244b are patterned simultaneously. In other words, the second metal layer 254b and the storage layer 244b within the same second film stack 200b have a same length along the first direction D1. On the other hand, the first metal layer 234b, the semiconductor layer 222b, and the isolation layer 214b are patterned simultaneously. In other words, the first metal layer 234b, the semiconductor layer 222b, and the isolation layer 214b within the same second film stack 200b have a same length along the first direction D1. As illustrated in FIG. 1J, after the patterning process, top surfaces of the first metal layers 236a, the second metal layers 256a, the first metal layers 234b, and the second metal layers 254b are at least partially exposed.

Figure 1K:
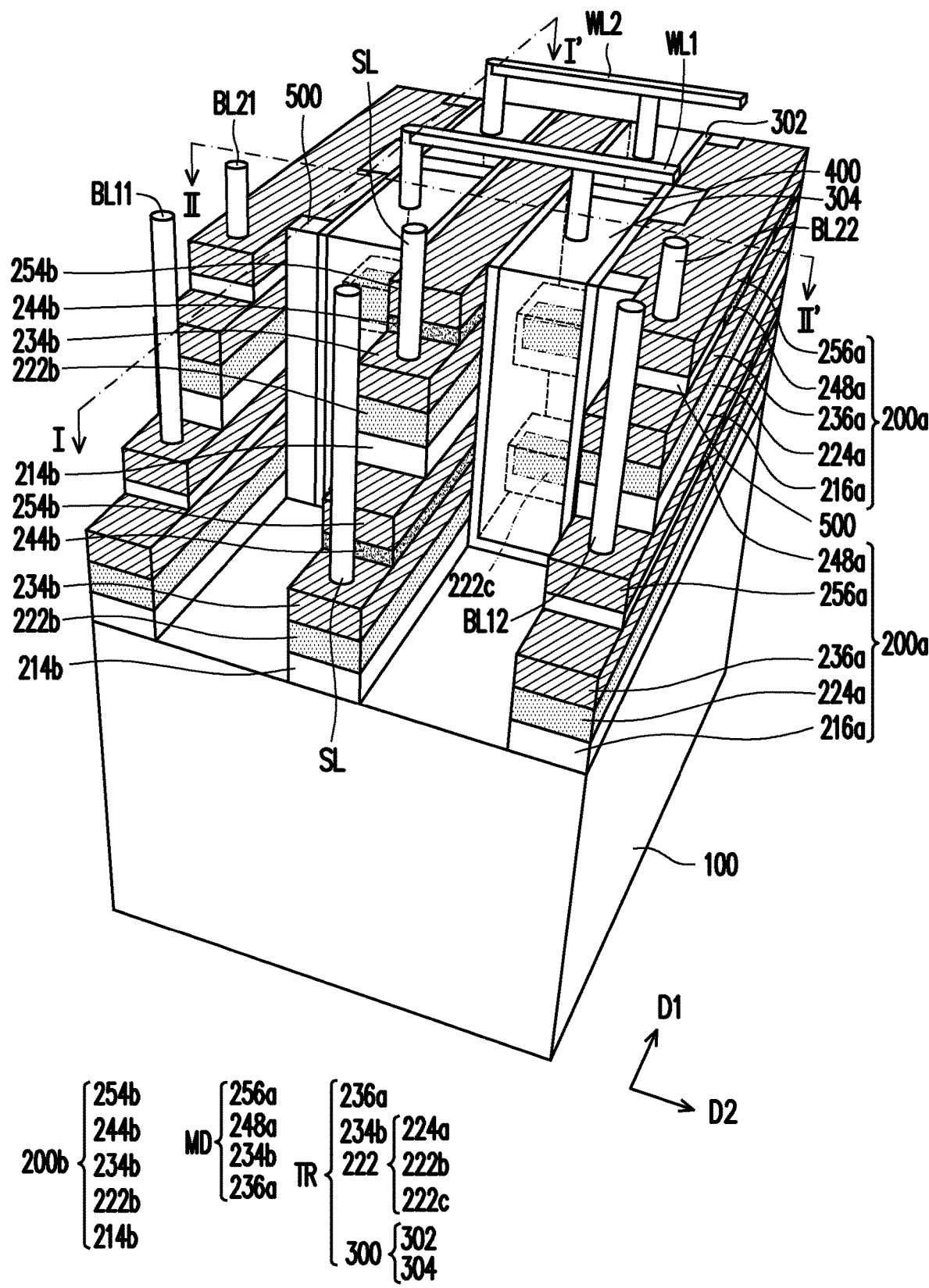
Figure 2K:
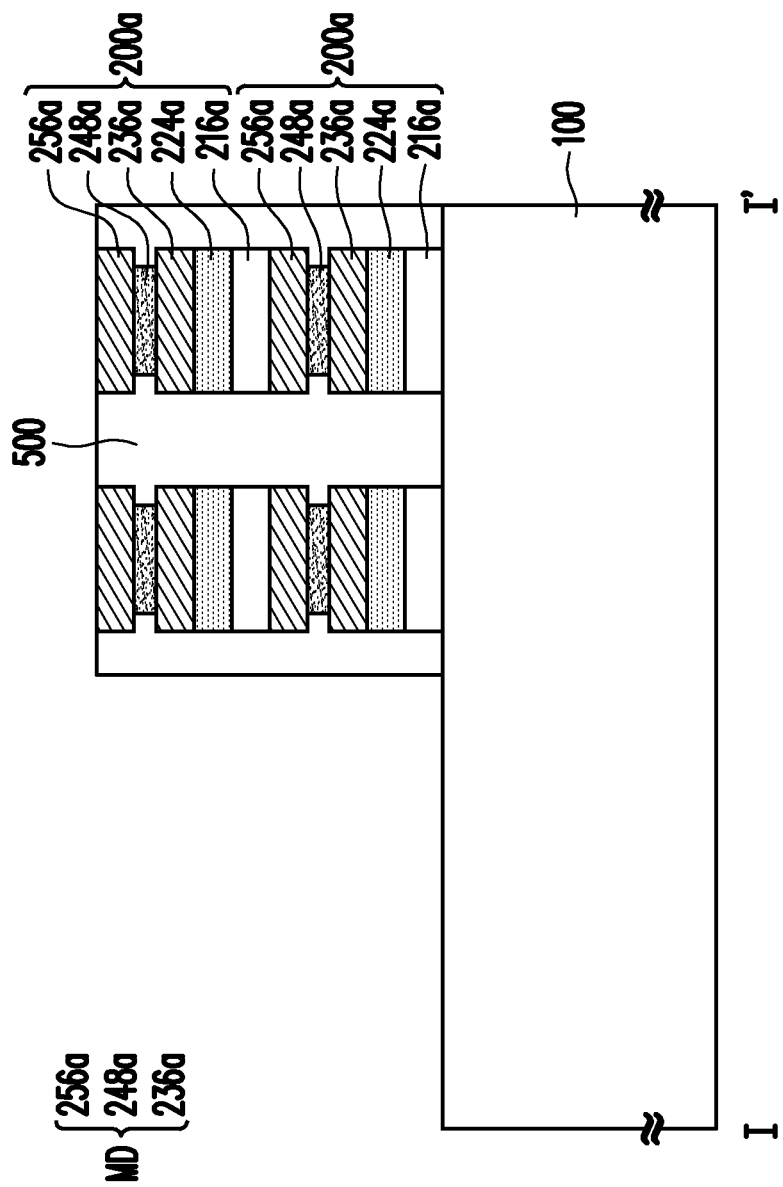
Figure 3K:
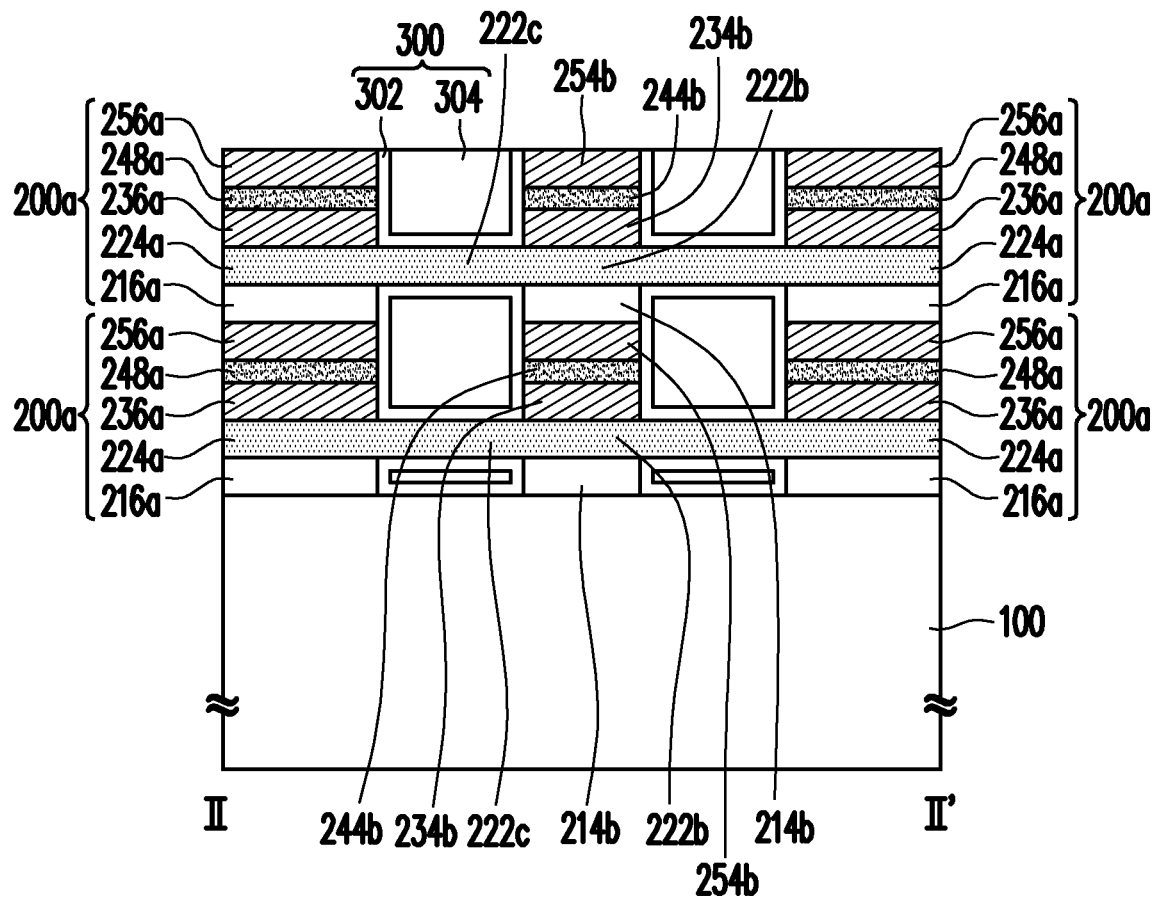

FIG. 1K is a perspective view illustrating one of various stages of a method of manufacturing a semiconductor device 10 in accordance with some embodiments of the disclosure. FIG. 2K is a cross-sectional view taken along line I-I' of FIG. 1K and FIG. 3K is a cross-sectional view taken along line II-II' of FIG. 1K. Referring to FIGS. 1K, 2K, and 3K, a plurality of bit line contacts BL11, BL12, BL21, BL22, a plurality of source line contacts SL, and a plurality of word line contacts WL1, WL2 are formed to obtain the semiconductor device 10. In some embodiments, materials of the bit line contacts BL11, BL12, BL21, BL22, the source line contacts SL, and the word line contacts WL1, WL2 may be the same as or different from one another. For example, materials of the bit line contacts BL11, BL12, BL21, BL22, the source line contacts SL, and the word line contacts WL1, WL2 include Al, Ti, TiN, TaN, Co, Ag, Au, Cu, Ni, Cr, Hf, Ru, W, Pt, or the like. In some embodiments, the bit line contacts BL11, BL12, BL21, BL22, the source line contacts SL, and the word line contacts WL1, WL2 are formed by a plating process. In some embodiments, the bit line contacts BL11, BL12, BL21, BL22 are electrically connected to bit lines, the source line contacts SL are electrically connect to source lines, and the word line contacts WL1, WL2 are electrically connected to word lines.

As illustrated in FIG. 1K, the bit line contacts BL11, BL12, BL21, BL22 are directly in contact with second metal layers 256a of the first film stacks 200a. In other words, the bit line contacts BL11, BL12, BL21, BL22 establish electrical connection between the second metal layers 256a (i.e. the top electrodes of the memory devices MD) of the first film stacks 200a with the bit line. In some embodiments, the source line contacts SL are directly in contact with the first metal layers 234b of the second film stacks 200b. In other words, the source line contacts SL establish electrical connection between the first metal layers 234b (i.e. the bottom electrodes of memory devices MD or the sources of the transistors TR) and the source lines. In some embodiments, the word line contacts WL1, WL2 are directly in contact with the gate electrodes 304. In other words, the word line contacts WL1, WL2 establish electrical connection between the gate electrodes 304 of the transistors TR and the word lines.

As illustrated in FIG. 1K, the second metal layers 254b of the second film stacks 200b are not connected to any of the contacts. In other words, the storage layer 244b and the second metal layer 254b in the second film stack 200b are electrically floating. That is, although the first metal layer 234b, the storage layer 244b, and the second metal layer 254b form a metal-insulator-metal (MIM) structure, the storage layer 244b and the second metal layer 254b cannot function as a memory device. Therefore, the storage layer 244b and the second metal layer 254b in the second film stack 200b may be respectively referred to as a dummy storage layer and a dummy electrode. In other words, the dummy storage layer and the dummy electrode are sequentially stacked on the first metal layer 234b (i.e. the second portion of the memory device MD or the source of the transistor TR).

In some embodiments, an interlayer dielectric layer (ILD; not shown) is formed over the semiconductor device 10. For example, the interlayer dielectric layer wraps around the bit line contacts BL11, BL12, BL21, BL22, the source line contacts SL, and the word line contacts WL1, WL2. In some embodiments, the interlayer dielectric layer includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some alternative embodiments, the interlayer dielectric layer includes low-k dielectric materials. Examples of low-k dielectric materials include BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the interlayer dielectric layer may include one or more dielectric materials and/or one or more dielectric layers. In some embodiments, the interlayer dielectric layer is formed to a suitable thickness by FCVD, CVD, HDPCVD, SACVD, spin-on, sputtering, or other suitable methods.

Figure 6:
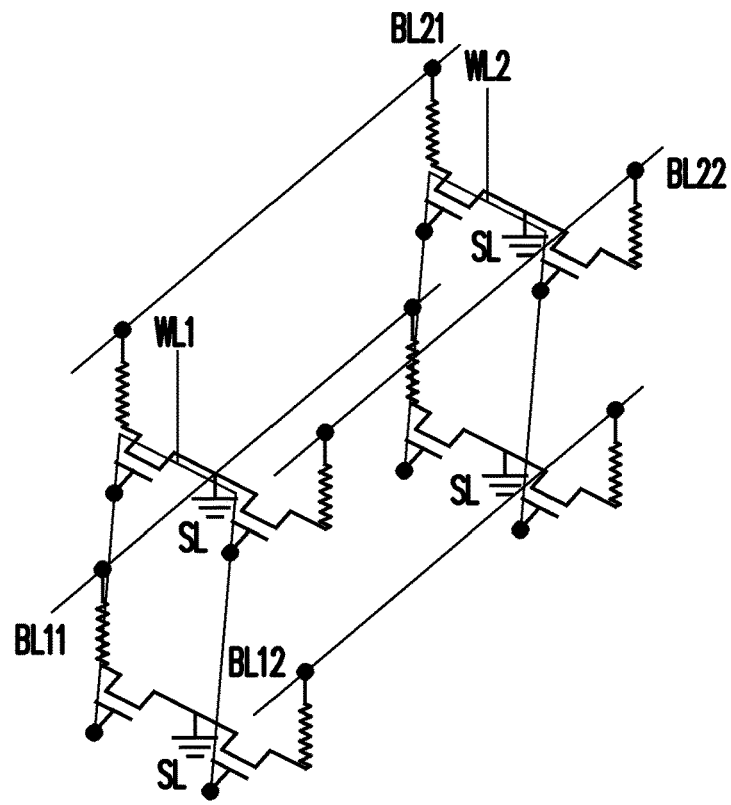
FIG. 6 is a circuit diagram of the semiconductor device in FIG. 1K.

The circuitry of the semiconductor device 10 in FIG. 1K will be discussed below in conjunction with FIG. 6. FIG. 6 is a circuit diagram of the semiconductor device 10 in FIG. 1K. Referring to FIG. 1K and FIG. 6, the semiconductor device 10 includes eight transistors TR and eight memory devices MD. Each memory device MD is connected to the corresponding transistor TR. For example, the drain of each transistor TR is connected to the bottom electrode of the corresponding memory device MD (i.e. the drain of each transistor TR serves as the bottom electrode of the corresponding memory device MD). In some embodiments, the sources of the transistors TR are connected to the source lines through source line contacts SL. As illustrated in FIG. 1K and FIG. 6, two adjacent transistors TR share the same source line/source line contact SL. In some embodiments, the top electrodes of the memory devices MD are connected to bit lines through bit line contacts BL11, BL12, BL21, BL22. On the other hand, the gates of the transistors TR are connected to the word lines through the word line contacts WL1, WL2.

In accordance with some embodiments of the disclosure, a semiconductor device includes a transistor and a memory device. The transistor includes a gate stack and a nanosheet penetrating through the gate stack. The memory device has a first portion and a second portion. A first portion of the gate stack is sandwiched between the first portion and the second portion of the memory device.

In accordance with some alternative embodiments of the disclosure, a semiconductor device includes a memory device and a transistor. The memory device includes a top electrode, a bottom electrode, and a storage layer sandwiched between the top electrode and the bottom electrode. The transistor is aside the memory device and includes a gate stack, a nanosheet, a source, and a drain. The nanosheet penetrates through the gate stack. The source and the drain are respectively disposed on two opposite sides of the gate stack. A first portion of the bottom electrode of the memory device serves as the drain of the transistor, and a second portion of the bottom electrode of the memory device serves as the source of the transistor.

In accordance with some embodiments of the disclosure, a manufacturing method of a semiconductor device includes at least the following steps. A substrate is provided. A film stack structure is formed over the substrate. The film stack structure includes a first isolation material layer, a semiconductor material layer, a first metal layer, a storage material layer, and a second metal layer. A portion of the film stack structure is removed to form a first film stack, a second film stack, and a channel connecting the first film stack and the second film stack. A gate stack is formed to wrap around the channel. A portion of the first film stack is removed to form recesses in the first film stack. The second metal layer of the first film stack forms a top electrode of a memory device aside the gate stack. The first metal layer of the first film stack forms a first portion of a bottom electrode of the memory device. A portion of the storage material layer of the first film stack is laterally removed to form indentations. The storage material layer of the first film stack forms a storage layer of the memory device. The indentations are filled with a second isolation material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a transistor, comprising:
        a gate stack; and
        a nanosheet penetrating through the gate stack;
    a memory device having a first portion and a second portion, and a first portion of the gate stack is sandwiched between the first portion and the second portion of the memory device; and
    a dummy storage layer and a dummy electrode sequentially stacked on the second portion of the memory device.

2. The semiconductor device of claim 1, wherein the first portion of the memory device is spatially separated from the second portion of the memory device.

3. The semiconductor device of claim 1, wherein the first portion of the memory device comprises:
    a top electrode;
    a first portion of a bottom electrode; and
    a storage layer sandwiched between the top electrode and the first portion of the bottom electrode.

4. The semiconductor device of claim 3, wherein the second portion of the memory device comprises a second portion of the bottom electrode.

5. The semiconductor device of claim 3, wherein the gate stack comprises:
    a gate electrode; and
    a gate dielectric layer wraps around the gate electrode, wherein the storage layer is in physical contact with the gate dielectric layer.

6. The semiconductor device of claim 1, further comprising isolation layers, and a second portion of the gate stack is sandwiched between the isolation layers.

7. The semiconductor device of claim 1, wherein the nanosheet has a first portion and a second portion, the first portion of the nanosheet extends along a first direction, and the second portion of the nanosheet extends along a second direction perpendicular to the first direction.

8. The semiconductor device of claim 7, wherein the second portion of the nanosheet penetrates through the gate stack, and the first portion of the nanosheet is located directly underneath the first portion and the second portion of the memory device.

9. A semiconductor device, comprising:
    a memory device, comprising:
        a top electrode;
        a bottom electrode; and
        a storage layer sandwiched between the top electrode and the bottom electrode; and
    a transistor aside the memory device, comprising:
        a gate stack;
        a nanosheet penetrating through the gate stack; and a source and a drain, respectively disposed on two opposite sides of the gate stack, wherein a first portion of the bottom electrode of the memory device serves as the drain of the transistor, and a second portion of the bottom electrode of the memory device serves as the source of the transistor.

10. The semiconductor device of claim 9, further comprising a dummy storage layer and a dummy electrode sequentially stacked on the source of the transistor.

11. The semiconductor device of claim 9, wherein the nanosheet has a first portion and a second portion, the first portion of the nanosheet extends along a first direction, and the second portion of the nanosheet extends along a second direction perpendicular to the first direction.

12. The semiconductor device of claim 11, wherein the second portion of the nanosheet penetrates through the gate stack, and the first portion of the nanosheet is located directly underneath the bottom electrode.

13. The semiconductor device of claim 9, wherein the gate stack comprises:
a gate electrode; and
a gate dielectric layer wraps around the gate electrode.

14. The semiconductor device of claim 13, wherein the gate electrode is spatially separated from the memory device and the nanosheet by the gate dielectric layer.

15. The semiconductor device of claim 9, wherein the bottom electrode of the memory device is directly in contact with the nanosheet.

16. A manufacturing method of a semiconductor device, comprising:
providing a substrate;
forming a film stack structure over the substrate, wherein the film stack structure comprises a first isolation material layer, a semiconductor material layer, a first metal layer, a storage material layer, and a second metal layer;
removing a portion of the film stack structure to form a first film stack, a second film stack, and a channel connecting the first film stack and the second film stack;
forming a gate stack to wrap around the channel;
removing a portion of the first film stack to form recesses in the first film stack, wherein the second metal layer of the first film stack forms a top electrode of a memory device aside the gate stack, and the first metal layer of the first film stack forms a first portion of a bottom electrode of the memory device;
laterally removing a portion of the storage material layer of the first film stack to form indentations, wherein the storage material layer of the first film stack forms a storage layer of the memory device; and
filling the indentations with a second isolation material layer.

17. The method of claim 16, wherein the step of removing the portion of the film stack structure to form the first film stack, the second film stack, and the channel comprises:
removing a portion of the first isolation material layer, a portion of the semiconductor material layer, a portion of the first metal layer, a portion of the storage material layer, and a portion of the second metal layer of the film stack structure to form the channel and trenches in the film stack structure; and
removing the first isolation material layer, the first metal layer, the storage material layer, and the second metal layer above and below the channel to form the first film stack and the second film stack.

18. The method of claim 16, further comprising filling the recesses with the second isolation material layer.

19. The method of claim 16, wherein forming the gate stack comprising:
depositing a gate dielectric material layer over the first film stack, the second film stack, and the channel;
forming a gate electrode material layer over the gate dielectric material layer; and
removing a portion of the gate electrode material layer and a portion of the gate dielectric material layer until the first film stack and the second film stack are exposed.

20. The method of claim 16, wherein the first metal layer of the second film stack forms a second portion of the bottom electrode of the memory device.

* * * * *